United States Patent
Pohm et al.

[11] Patent Number: 5,949,707
[45] Date of Patent: *Sep. 7, 1999

[54] GIANT MAGNETORESISTIVE EFFECT MEMORY CELL

[75] Inventors: Arthur V. Pohm, Ames, Iowa; Brenda A. Everitt, Eden Prairie, Minn.

[73] Assignee: Nonvolatile Electronics, Incorporated, Eden Prairie, Minn.

[ * ] Notice: This patent issued on a continued prosecution application filed under 37 CFR 1.53(d), and is subject to the twenty year patent term provisions of 35 U.S.C. 154(a)(2).

[21] Appl. No.: 08/704,315

[22] Filed: Sep. 6, 1996

[51] Int. Cl.⁶ .................................................. G11C 11/00
[52] U.S. Cl. ............................. 365/158; 365/171; 365/173
[58] Field of Search ..................................... 365/171, 173, 365/158, 172

[56] References Cited

U.S. PATENT DOCUMENTS

| | | | |
|---|---|---|---|
| 5,134,533 | 7/1992 | Friedrich et al. | 360/113 |
| 5,159,513 | 10/1992 | Dieny et al. | 360/113 |
| 5,206,590 | 4/1993 | Dieny et al. | 324/252 |
| 5,343,422 | 8/1994 | Kung et al. | 365/173 |
| 5,347,485 | 9/1994 | Taguchi et al. | 365/171 |
| 5,432,373 | 7/1995 | Johnson | 257/421 |
| 5,432,734 | 7/1995 | Kawano et al. | 365/158 |
| 5,448,515 | 9/1995 | Fukami et al. | 365/171 |
| 5,459,687 | 10/1995 | Sakakima et al. | 365/158 |
| 5,477,482 | 12/1995 | Prinz | 365/129 |
| 5,549,978 | 8/1996 | Iwasaki et al. | 428/692 |
| 5,702,831 | 12/1997 | Chen et al. | 428/611 |
| 5,703,805 | 12/1997 | Tehrani et al. | 365/173 |
| 5,768,183 | 6/1998 | Zhu | 365/173 |

OTHER PUBLICATIONS

Design, Simulation, and Realization of Solid State Memory Element Using the Weakly Coupled GMR Effect: by Wang et al., *IEEE Transactions on Magnetics*, vol. 32, No. 2, Mar. 1996.

"Quarternary Giant Magnetoresistance Random Access Memory" by Wang et al., *J. Appl. Phys.*, 79 (8), Apr. 15, 1996, pp. 6639–6641.

"Analytical Model in a Weakly Coupled Sandwich for Memory Purposes" by Wang et al., *J. Appl. Phys.*, 79 (8), Apr. 15, 1996, pp. 6649–6651.

"Solid–State Memory Using GMR Films" by H. Sakakima et al., Central Research Lab, Matsushita Elec. Ind. Co., Ltd., vol. 20, No. 1, 1996.

*Primary Examiner*—A. Zarabian
*Attorney, Agent, or Firm*—Kinney & Lange, P.A.

[57] ABSTRACT

A digital data memory having a bit structure in a memory cell based on an intermediate separating material with two major surfaces having thereon a magnetoresistive, anisotropic ferromagnetic thin-film of differing thicknesses. These bit structures are fabricated within structural extent limits to operate satisfactorily, and are fabricated as series connected members of storage line structures. A corresponding conductive word line structure adjacent corresponding ones of these memory cells is used for selecting or operating them, or both, in data storage and retrieval operations.

45 Claims, 7 Drawing Sheets

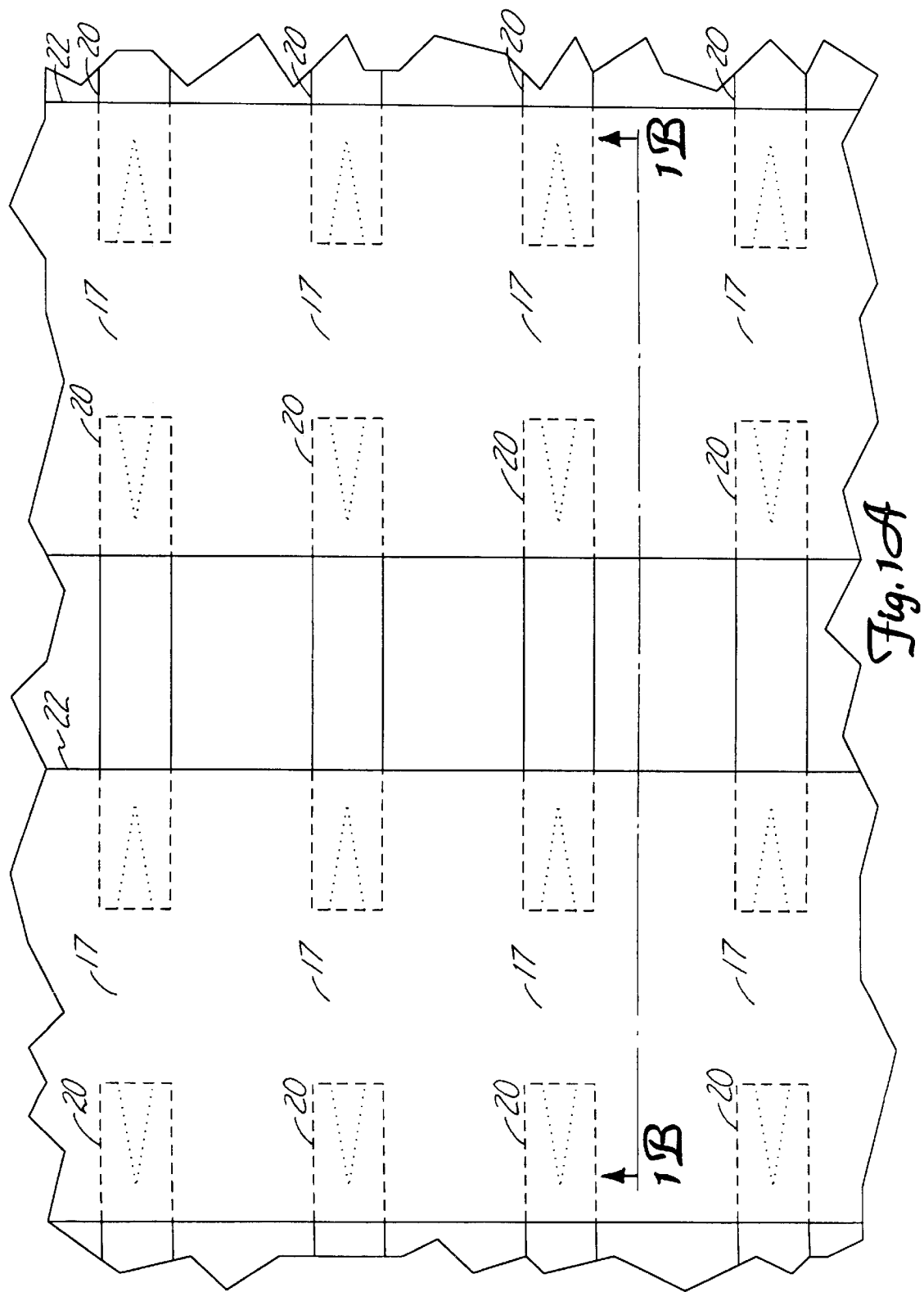

GIANT MAGNETORESISTIVE EFFECT MEMORY CELL

This invention was made with government support under contract N00014-93-C-0251 awarded by the Department of the Navy and NSF9508538 awarded by the National Science Foundation. The government has certain rights in this invention.

BACKGROUND OF THE INVENTION

The present invention relates to ferromagnetic thin-film structures exhibiting relatively large magnetoresistive characteristics and, more particularly, to such structures used for the storage and retrieval of digital data.

Many kinds of electronic systems make use of magnetic devices including both digital systems, such as memories, and analog systems such as magnetic field sensors. Digital data memories are used extensively in digital systems of many kinds including computers and computer systems components, and digital signal processing systems. Such memories can be advantageously based on the storage of digital symbols as alternative states of magnetization in magnetic materials provided in each memory storage cell, the result being memories which use less electrical power and do not lose information upon removals of such electrical power.

Such memory cells, and magnetic field sensors also, can often be advantageously fabricated using ferromagnetic thin-film materials, and are often based on magnetoresistive sensing of magnetic states, or magnetic conditions, therein. Such devices may be provided on a surface of a monolithic integrated circuit to provide convenient electrical interconnections between the device and the operating circuitry therefor.

Ferromagnetic thin-film memory cells, for instance, can be made very small and packed very closely together to achieve a significant density of information storage, particularly when so provided on the surface of a monolithic integrated circuit. In this situation, the magnetic environment can become quite complex with fields in any one memory cell affecting the film portions in neighboring memory cells. Also, small ferromagnetic film portions in a memory cell can lead to substantial demagnetization fields which can cause instabilities in the magnetization state desired in such a cell.

These magnetic effects between neighbors in an array of closely packed ferromagnetic thin-film memory cells can be ameliorated to a considerable extent by providing a memory cell based on an intermediate separating material having two major surfaces on each of which an anisotropic ferromagnetic memory thin-film is provided. Such an arrangement provides significant "flux closure," i.e. a more closely confined magnetic flux path, to thereby confine the magnetic field arising in the cell to affecting primarily just that cell. This result is considerably enhanced by choosing the separating material in the ferromagnetic thin-film memory cells to each be sufficiently thin. Similar "sandwich" structures are also used in magnetic sensors.

In the recent past, reducing the thicknesses of the ferromagnetic thin-films and the intermediate layers in extended "sandwich" structures, and adding possibly alternating ones of such films and layers, i.e. superlattices, have been shown to lead to a "giant magnetoresistive effect" being present in some circumstances. This effect yields a magnetoresistive response which can be in the range of up to an order of magnitude greater than that due to the well known anisotropic magnetoresistive response.

In the ordinary anisotropic magnetoresistive response, varying the difference occurring between the direction of the magnetization vector in a ferromagnetic thin-film and the direction of sensing currents passed through that film leads to varying effective electrical resistance in the film in the direction of the current. The maximum electrical resistance occurs when the magnetization vector in the field and the current direction therein are parallel to one another, while the minimum resistance occurs when they are perpendicular to one another. The total electrical resistance in such a magnetoresistive ferromagnetic film can be shown to be given by a constant value, representing the minimum resistance, plus an additional value depending on the angle between the current direction in the film and the magnetization vector therein. This additional resistance has a magnitude characteristic that follows the square of the cosine of that angle.

Operating magnetic fields imposed externally can be used to vary the angle of the magnetization vector in such a film portion with respect to the easy axis of that film. Such an axis comes about in the film because of an anisotropy therein typically resulting from depositing the film during fabrication in the presence of an external magnetic field oriented in the plane of the film along the direction desired for the easy axis in the resulting film. During subsequent operation of the device having this resulting film, such operational magnetic fields imposed externally can be used to vary the angle to such an extent as to cause switching of the film magnetization vector between two stable states which occur for the magnetization being oriented in opposite directions along the film's easy axis. The state of the magnetization vector in such a film can be measured, or sensed, by the change in resistance encountered by current directed through this film portion. This arrangement has provided the basis for a ferromagnetic, magnetoresistive anisotropic thin-film to serve as a memory cell.

In contrast to this arrangement, the resistance in the plane of a ferromagnetic thin-film is isotropic for the giant magnetoresistive effect rather than depending on the direction of the sensing current therethrough as for the anisotropic magnetoresistive effect. The giant magnetoresistive effect involves a change in the electrical resistance of the structure thought to come about from the passage of conduction electrons between the ferromagnetic layers in the "sandwich" structure, or superlattice structure, through the separating non-magnetic layers with the resulting scattering occurring at the layer interfaces, and in the ferromagnetic layers, being dependent on the electron spins. The magnetization dependant component of the resistance in connection with this effect varies as the sine of the absolute value of half the angle between the magnetizations in the ferromagnetic thin-films provided on either side of an intermediate non-magnetic layer. The electrical resistance in the giant magnetoresistance effect through the "sandwich" or superlattice structure is lower if the magnetizations in the separated ferromagnetic thin-films are parallel and oriented in the same direction than it is if these magnetizations are antiparallel, i.e. oriented in opposing or partially opposing directions. Further, the anisotropic magnetoresistive effect in very thin films is considerably reduced from the bulk values therefor in thicker films due to surface scattering, whereas a significant giant magnetoresistive effect is obtained only in very thin films. Nevertheless, the anisotropic magnetoresistive effect remains present in the films used in giant magnetoresistive effect structures.

As indicated above, the giant magnetoresistive effect can be increased by adding further alternate intermediate nonmagnetic and ferromagnetic thin-film layers to extend a "sandwich" structure into a stacked structure, i.e. a superlattice structure. The giant magnetoresistive effect is sometimes called the "spin valve effect" in view of the explanation that a larger fraction of conduction electrons are allowed to move more freely from one ferromagnetic thin-film layer to another if the magnetizations in those layers are parallel than if they are antiparallel or partially antiparallel to thereby result in the magnetization states of the layers acting as sort of a "valve."

Thus, a digital data memory cell based on the use of structures exhibiting the giant magnetoresistive effect is attractive as compared to structures based on use of an anisotropic magnetoresistive effect because of the larger signals obtainable in information retrieval operations with respect to such cells. Such larger magnitude signals are easier to detect without error in the presence of noise thereby leading to less critical requirements on the retrieval operation circuitry.

A memory cell structure suitable for permitting the storing and retaining of a digital bit of information, and for permitting retrieving same therefrom has been demonstrated based on a multiple layer "sandwich" construction in a rectangular solid. This cell has a pair of ferromagnetic layers of equal thickness and area separated by a non-magnetic layer of the same area but smaller thickness. These ferromagnetic layers are each a composite layer formed, of two stratums each of a different magnetic material there being a relatively thin ferromagnetic stratum in each of the composite layers adjacent the non-magnetic layer and a thicker ferromagnetic stratum in each of the composite layers adjacent the thin ferromagnetic stratum therein. The ferromagnetic material of the thick stratum in one of the composite layers is the same as that in the thin stratum in the other composite layer, and the ferromagnetic material of the thin stratum in the first composite layer is the same as the ferromagnetic material in the thick stratum of the second composite layer. Each of the composite layers is fabricated in the presence of a magnetic field so as to result in having an easy axis parallel to the long sides of the rectangular solid. The dimensions of the cell structure were 10 µm in length and 5 µm in width with a non-magnetic layer of thickness 30 Å. The composite ferromagnetic layers are each formed of a 5 Å thin stratum at a 50 Å thick stratum.

Thus, this memory cell structure has a pair of ferromagnetic layers of the matching geometries but different magnetic materials in the strata therein to result in one such layer having effectively a greater saturation magnetization and a greater anisotropy field than the other to result in different coercivities in each. In addition, the structure results in a coupling of the magnetization between the two ferromagnetic layers therein due to exchange coupling between them leading to the magnetizations in each paralleling one another in the absence of any applied magnetic fields. As a result, the electrical resistance of the cell along its length versus applied magnetic fields in either direction parallel thereto is represented by two characteristics depending on the magnetization history of the cell. Each of these characteristics exhibits a peak in this resistance for applied longitudinal fields having absolute values that are somewhat greater than zero, one of these characteristics exhibiting its peak for positive applied longitudinal fields and the other characteristic exhibiting its peak for negative applied longitudinal fields. The characteristic followed by the resistance of the cell for relatively small applied longitudinal fields depends on which direction the magnetization is oriented along the easy axis for the one of the two ferromagnetic layers having the larger coercivity. Thus, by setting the magnetization of the layer with the higher coercivity, a bit of digital information can be stored and retained, and the value of that bit can be retrieved without affecting this retention through a determination of which characteristic the resistance follows for a relatively small applied longitudinal field.

Such memory cell behavior for this structure can be modeled by assuming that the ferromagnetic layers therein are each a single magnetic domain so that positioning of the magnetization vectors in the ferromagnetic layers is based on coherent rotation, and that uniaxial anisotropies characterize those layers. The angles of the magnetization vectors in the two ferromagnetic layers with respect to the easy axis in those layers are then found by minimizing the magnetic energy of these anisotropies summed with that due to the applied external fields and to exchange coupling. That total energy per unit volume is then $$E_{Tot} = E_1 + E_2 + E_{12}$$
$$= K_{u_1} \sin^2\theta_1 - M_{s_1} H\cos(\psi - \theta_1) +$$
$$K_{u_2} \sin^2\theta_2 - M_{s_2} H\cos(\psi - \theta_2) + A_{12}\cos(\theta_1 - \theta_2).$$

As indicated above, once the magnetization vectors have taken an angular position with respect to the easy axis of the corresponding layer at a minimum in the above indicated energy, the effective resistance between the ends of the memory cell structure is determined by the net angle between the magnetization vectors in each of these layers.

Because of the assumption of single domain behavior in the ferromagnetic layers, the above equation would seemingly be expected to improve its approximation of the system total magnetic energy as the length and width of that memory cell structure decreased toward having submicron dimensions. However, this mode of operation described for providing the two magnetoresistive characteristics based on the history of the magnetization, in depending on the differing anisotropy fields in the two ferromagnetic layers because of the differing materials used therein, becomes less and less reliable as these dimensions decrease. This appears to occur because decreasing the cell dimensions gives rise to larger and larger demagnetizing fields in the two ferromagnetic layers which, at some point, overwhelm the effects of the anisotropy fields so that the above described behavior no longer occurs as described. In addition, the magnetizations of the two ferromagnetic layers rotate together under the influences of externally applied fields at angles with respect to the corresponding easy axis at angular magnitudes much more nearly equal to one another because of the increasing demagnetization fields in these layers as the dimensions thereof decrease. As a result, these ferromagnetic layers are less and less able to have the magnetizations thereof switch directions of orientation independently of one another as the dimensions thereof decrease so that the structure they are in becomes less able to provide the above described memory function in relying on only these ferromagnetic layer anisotropy differences. Thus, an alternative arrangement is desired for such "sandwich" structure, or superlattice structure, memory cells having submicron dimensions which provide desirable magnetoresistance versus applied magnetic field characteristics that can be used for storing and retrieving data bits of information.

SUMMARY OF THE INVENTION

The present invention provides a digital data memory having a bit structure in a memory cell based on an intermediate separating material with two major surfaces on each of which there is a magnetoresistive, anisotropic ferromagnetic thin-film but of differing thicknesses. The ferromagnetic film at each such surface is a composite film having a thinner stratum of higher magnetic saturation induction adjacent the intermediate material and a thicker stratum of lower magnetic saturation induction. These bit structures are fabricated within structural extent limits to operate satisfactorily, and are fabricated as series connected members of storage line structures. A corresponding conductive word line structure for each of such memory cells is positioned adjacent the ferromagnetic film on one of these surfaces but separated therefrom for use in selecting or operating corresponding ones of these memory cells, or both, in data storage and retrieval operations.

BRIEF DESCRIPTION OF THE DRAWINGS

FIGS. 1A and 1B represent a plan view of a portion of a monolithic integrated circuit structure embodying the present invention and a layer diagram of a part of this structure.

DETAILED DESCRIPTION OF THE PREFERRED EMBODIMENTS

A digital data bit storage and retrieval memory cell suited for fabrication with submicron dimensions can be fabricated using ferromagnetic thin-film materials of similar kinds in each of the magnetic memory films used in a giant magnetoresistive "sandwich" structure on either side of an intermediate nonmagnetic layer, but with different thicknesses in those films at each major surface of the intermediate layer. Such devices may be provided on a surface of a monolithic integrated circuit to thereby allow providing convenient electrical connections between the memory cell device and the operating circuitry therefor.

Figure 1B:
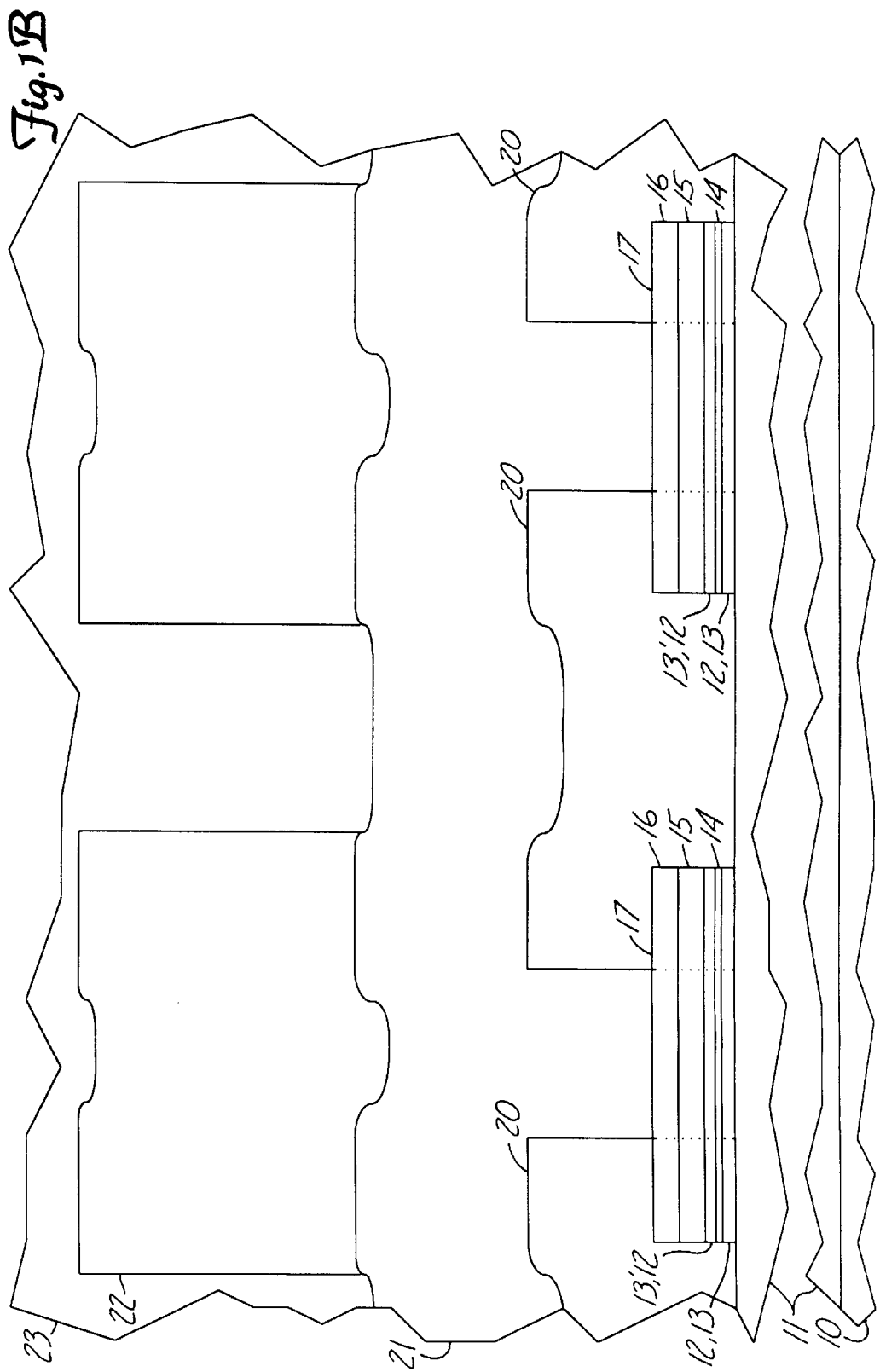

A "sandwich" structure for such a memory cell, based on having an intermediate thin layer of a non-magnetic separating material with two major surfaces on each of which a magnetoresistive, anisotropy ferromagnetic thin-film is positioned, exhibits the "giant magnetoresistive effect" if the materials for the ferromagnetic thin-films and the intermediate layers are properly selected and have sufficiently small thicknesses. This effect can be enhanced by forming such cells of additional alternating ones of these ferromagnetic films and intermediate layers to form superlattices. The resulting enhanced "giant magnetoresistive effect" can yield a magnetoresistive response which can be in the range of up to an order of magnitude greater than that due to the well known anisotropic magnetoresistive response. Giant magnetoresistive effect structures are described in earlier filed co-pending applications by J. M. Daughton entitled "Magnetoresistive Structure With Alloy Layer" having Ser. No. 08/384,647 and "Magnetic Structure with Stratified Layers" having Ser. No. 08/096,765 both of which are assigned to the same assignee as the present application and are hereby incorporated herein by reference. FIG. 1A shows a plan view of an example of such memory cells as a part of a digital memory formed as a portion of a monolithic integrated circuit, including a supporting semiconductor chip as part of the memory substrate, which can have conveniently provided therein the operating circuitry for this memory. FIG. 1B shows a fragmentary view of a portion of the view shown in FIG. 1A to show the layered structure thereof, and also has parts thereof broken out to show some the structure therebelow, again for greater clarity. The protective layer provided over portions of the structure shown in FIG. 1A in actual use has been omitted in this view for clarity, but that layer is shown in part in FIG. 1B. Certain other portions of some layers have been omitted, again for clarity, so that the structure portions present are shown in solid line form if they are exposed in the absence of some layer thereover now omitted, but with other structure portions beneath the solid line form portions appearing in these figures being shown in dashed line form.

Figure 2:
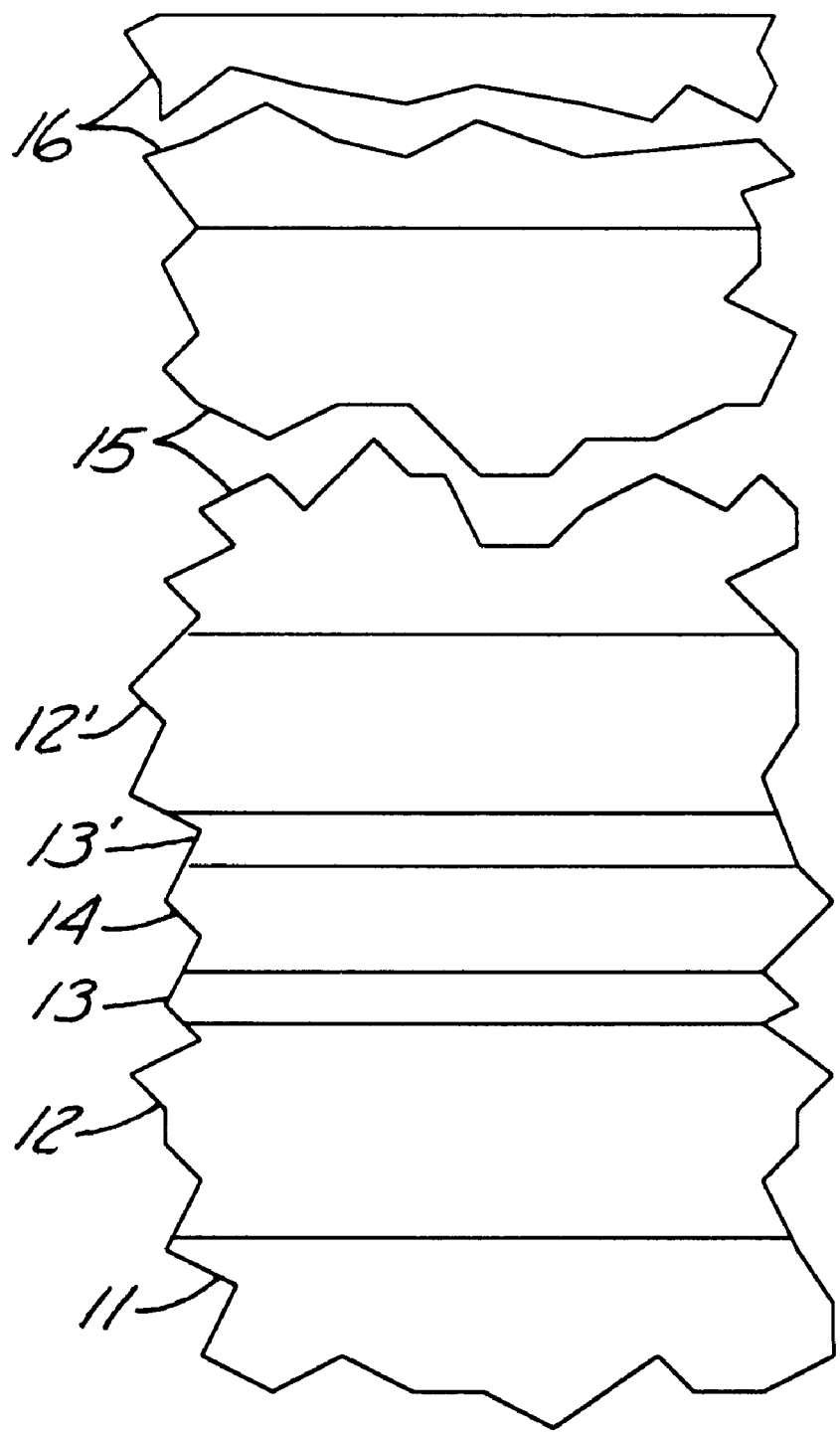
FIG. 2 represents a fragmentary portion of the layer diagram of FIG. 1B.

Corresponding to FIGS. 1A and 1B is FIG. 2 which is a layer diagram of a corresponding portion of the structure shown in FIGS. 1A and 1B. This layer diagram gives an indication of the structural layers leading to portions of the structure shown in FIGS. 1A and 1B, but FIGS. 1B and 2 are not true cross section views in that many dimensions therein are exaggerated or reduced for purposes of clarity.

As indicated above, the memory cell structures are typically provided on a semiconductor chip, 10, having suitable operating circuitry for the memory provided therein. An electrical insulating layer, 11, formed on semiconductor chip 10 by sputter deposition of silicon nitride, supports memory cell "sandwich" structures comprising a pair of ferromagnetic thin-film layers that are separated from one another by a non-magnetic, electrically conductive intermediate layer as will be described in more detail below. A portion of just layer 11 is shown in the higher resolution drawing of FIG. 2. Typically, layer 11 is formed by this silicon nitride deposited to a thickness of about 10,000 Å.

Thereafter, the "sandwich" structures mentioned above are provided on layer 11 with each of the ferromagnetic thin-film layers and the intermediate layer being provided through sputter deposition as the basis for forming the magnetoresistive memory cell. This multilayer structure will have a sheet resistivity of approximately 12 $\Omega/\square$, or higher, and will exhibit a giant magnetoresistive effect exceeding 5%.

In this structure, the first layer provided is a composite ferromagnetic thin-film layer sputter deposited onto nitride layer 11 with the result shown in FIG. 2. A first stratum, 12, of this composite ferromagnetic thin-film layer is formed of an alloy of 65% nickel, 15% iron and 20% cobalt deposited to a thickness of 40 Å which has a magnetic saturation induction of typically about 10,000 Gauss. The deposition of this layer occurs in the presence of an external magnetic field in the plane of the film oriented along a direction parallel to the plane of the figure in FIG. 1A, and this process results in the deposited film having a face-centered cubic structure. This fabrication magnetic field will leave the easy axis of the film directed along the plane of that figure.

A second stratum, 13, is also provided in a sputter deposition step in the presence of a similar fabrication magnetic field. Second stratum 13 is formed of 5% iron and 95% cobalt to a thickness of 15 Å resulting in this material having a magnetic saturation,induction of approximately 16,000 Gauss which is a higher value than that of the magnetic saturation induction of first stratum 12. This higher saturation material is provided adjacent the intermediate layer, which is next to be formed, to obtain a greater giant magnetoresistive effect, but the lower saturation value in stratum 12 is provided to keep the resulting composite film more sensitive to smaller fields than it would be in its absence. This composite layer is designated 12,13 in FIG. 1B.

Thereafter, an intermediate layer, 14, is provided by sputter deposition onto layer 13, this intermediate layer being electrically conductive but non-magnetic. Layer 14 is typically formed of copper to a thickness of 30 Å. The provision of layer 14 is followed by a second composite ferromagnetic thin-film layer that is provided on layer 14, and its structure matches that of the first composite ferromagnetic layer comprising strata 12 and 13, except for being thinner and reversed in strata order, because of the use of essentially the same deposition steps. As a result, the stratum having the greater magnetic saturation induction is again adjacent to layer 14 in this second composite layer, and the lesser magnetic saturation induction stratum is provided thereon but with a thickness of only 25 Å. Since the strata are otherwise the same, they have been designated in FIG. 2 as 13' and 12' in correspondence to strata 13 and 12.

After completing this "sandwich" structure, a 200 Å layer of tantalum or tantalum nitride is sputter deposited on stratum 12' to passivate and protect stratum 12' therebelow, and to allow electrical interconnections thereto for circuit purposes. The resulting layer, 15, of tantalum or tantalum nitride, because of its conductivity, leads to the occurrence of some shunting away of current from the rest of the memory cell to thereby result in an effective reduction of the giant magnetoresistive effect achieved by the constructed cell. Layer 15 is shown in broken form in FIG. 2 because of its significantly greater thickness compared to the ferromagnetic composite layers and the non-magnetic intermediate layer.

Similarly, a further layer, 16, is deposited on layer 15, and is shown in broken form in FIG. 2 because of its relatively greater thickness of 100 Å. Layer 15 is first sputter cleaned which removes around 75 Å thereof. Then, layer 16 is sputter deposited on clean layer 15 as a chrome silicon layer with 40% chrome and 60% silicon to serve as an etch stop for the subsequent etching of a layer to be provided thereover as a milling mask.

That is, another layer of silicon nitride is sputter deposited on layer 16 to a depth of 1000 Å to be used as a milling mask, but this layer is not shown in FIG. 2 because its remnants will be incorporated in a further insulating layer to be provided later. On this silicon nitride mask layer, photoresist is deposited and patterned in such a way as to form a pattern for an etching mask which is to be formed following that pattern by leaving the masked portions of the silicon nitride layer therebelow after etching. This last masking pattern in the silicon nitride is to result, after milling therethrough to remove the exposed ferromagnetic and non-magnetic layers therebelow, in a substantial number of separated bit structures to serve as the memory cells in the digital memory each with a "sandwich" construction. Reactive ion etching is used with the patterned photoresist to remove the exposed portions of the silicon nitride masking layer down to chrome silicon layer 16 serving as an etch stop. The remaining portions of the silicon nitride layer protected by the photoresist serve as the above mentioned milling mask for the subsequent ion milling step which removes the exposed portions of chrome silicon layer 16, and thereafter, also the then exposed portions of layer 15 the next exposed portions of the second composite ferromagnetic thin-film layer formed as strata 13' and 12', the subsequently exposed portions of intermediate nonmagnetic layer 14' and, finally, the resultingly exposed portions of the first composite ferromagnetic thin-film layer formed as strata 13 and 12 down to silicon nitride layer 11.

A portion of one of the resulting memory cells, 17, from FIG. 1A is shown in FIG. 2, and has counterparts thereof shown in FIG. 1B (where they are designated again by numeral 17) with only some of the layers in each such cell being represented as distinct in this latter figure. The full multilayer structure that is shown in FIG. 2 with the strata in the composite ferromagnetic layers is not shown used in that manner in FIG. 1B because of the larger scale used in that figure. Some of these memory cells can also be seen in the plan view of FIG. 1A, and each of such structures is also designated by numeral 17 in that figure. The easy axes of the ferromagnetic thin-film composite layers in each of memory cells 17 are parallel to the direction of longest extent in those structures. Each memory cell structure 17 is formed with a rectangular central portion in this plan view and with a triangular portion tapering away therefrom at each end.

Following the completion of memory cell structures 17, a first layer of metal for circuit interconnections is provided beginning with sputter cleaning to remove approximately half the thickness of the exposed portions of chrome silicon layer 16. This cleaning is followed by sputter depositing a layer of aluminum alloyed with 2% copper over memory cell structure 17 and the exposed portions of substrate 11 to result in this layer being electrically conductively connected to structures 17. Photoresist is provided over this metal layer and patterned to expose unwanted portions thereof which are subsequently removed by reactive ion etching. This step results in bit junction metal structures, 20, as seen in FIG. 1B, which electrically interconnect to one another adjacent ones of memory cell structures 17 occurring in the same row therewith by overlaying the adjacent triangular end portions of each.

These interconnected rows of bit structures, interconnected by the metal in the bit junction structures in that row, each form a storage line structure permitting the passing of an electrical current through all of those memory cell structures 17 and bit junctions 20 occurring in that row. Portions of such storage line structures can be seen in FIG. 1A where the rows forming those structures extend from left to right and contain memory cell structure 17 interconnected by bit junction structures 20. Also, openings will have been provided in substrate layer 11 and in some insulating layers therebelow prior to the deposition of the metal used to form bit junction structures 20 to allow interconnection of the storage line structures to the electronic circuitry in integrated circuit 10 therebelow.

The completion of bit junction structures 20 is followed by depositing another layer of typically 7500 Å of silicon nitride thereover, and over the exposed portions of memory cell structures 17 and of layer 11, to form an insulating layer, 21. Photoresist is provided over insulator layer 21 as an etching mask to provide via openings therethrough, and through silicon nitride layer 11 and appropriate ones of the insulating layers in integrated circuit 10.

On insulator layer 21, so prepared, a further metal deposition is made, again with aluminum alloyed of 2% copper, to cover that layer and fill the openings therein, and in silicon nitride layer 11 and the insulating layers in integrated circuit 10. This metal layer is typically deposited to a thickness of 3500 Å. Photoresist is spread thereover with openings therein where the unwanted portions of that metal layer are to be eliminated, and reactive ion etching is undertaken to provide this elimination of unwanted metal layer portions. The structures that result from this elimination are shown in FIG. 1B, and in FIG. 1A, as a plurality of word lines, 22, for the memory each positioned across insulating layer 21 from a corresponding memory cell structure 17 in each of the storage lines. As a result of the via openings, these word lines are also interconnected with electronic circuitry in integrated circuit 10 therebelow.

A further insulator layer, 23, is provided by sputter depositing 7500 Å of silicon nitride over word lines 22 and the exposed portions of insulator layer 21. Insulator layer 23 serves as a passivation and protection layer for the device structure therebelow. Layer 23 is seen in FIG. 1B but is not shown in FIG. 1A to avoid obscuring that figure.

The fabrication steps just described are, of course, applied to semiconductor material wafers having many integrated circuit chips therein to serve as memory substrates so that many such digital memories can be fabricated simultaneously in and on such wafers. Once all of memory cell structures 17 are fabricated on each chip substrate, along with all of the associated bit juncture structures and word lines structures as protected by the final insulating layer, the wafers are then ready for wafer testing, separating the individual devices into separate chips and packaging them.

The plan view of the shapes of bit structure 17, i.e. having a rectangular center portion tapering into triangular end portions at opposite end thereof, are not the only plan view geometrical shapes which can be used. An alternative would be to form memory cell structure 17 with a plan view geometry following a parallelogram, and have the bit junction structures covering the angled ends of the parallelogram so as to leave a central rectangular section uncovered by bit junction structures just as was done for the memory cell storage line structures of FIG. 1A. In a further alternative, for instance, memory cell structures 17 and bit junction structures 20 need not have their longest dimensions parallel with one another, but instead could form a meander storage line structure with succeeding ones of said bit junction structures 20 offset from one another and from the axis of extent of the storage line on opposite sides thereof. In this circumstance, memory cell structures 17 would then be oriented at an angle to this axis of extent to connect successive offset bit junction structures. Such an arrangement can improve the packing density of memory cell structures on an integrated circuit chip substrate.

Figure 3:
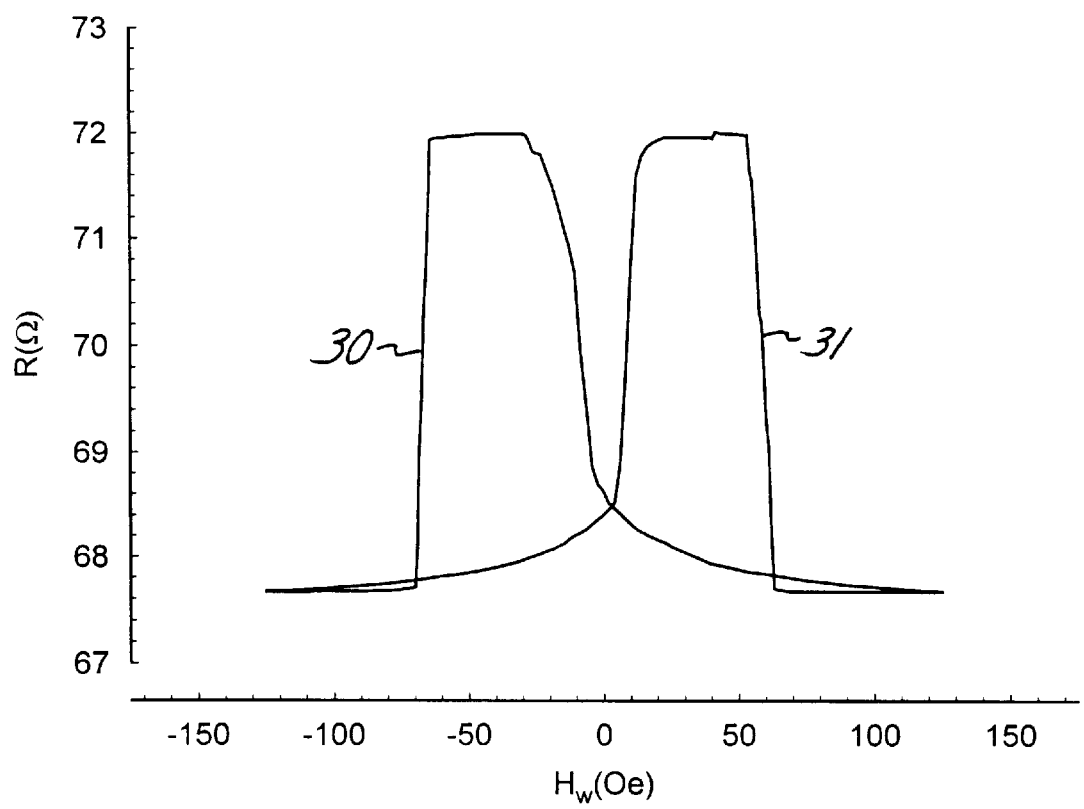
FIG. 3 shows a characteristic diagram for a structure similar to one of those shown in FIGS. 1A, 1B and 2, FIGS. 4A and 4B represent characteristic diagrams for structures similar to one of those shown in FIGS. 1A, 1B and 2, FIGS. 5A and 5B represent a plan view of a structure from FIGS. 1A, 1B and 2, and an approximation thereof.

A representation of a pair of typical magnetoresistance characteristics of a memory cell or bit structure 17 versus external magnetic fields applied long its length, i.e. along its easy axis, is shown in FIG. 3 for a bit structure example from a storage line structure having ten such bit structures therein. Memory cells 17 in this example are 2.2 $\mu$m long and 0.4 $\mu$m wide with those bit junction structures 20 interconnecting thereto overlapping 0.6 $\mu$m on each end thereof. Thicker composite layer 12,13 has a 55 Å thick stratum 12 and a 15 Å thick stratum 13. Thinner composite layer 13',12' has a 45 Å thick stratum 12' and a 15 Å thick stratum 13'. Intermediate layer 14 separating these composite ferromagnetic layers is 30 Å thick. A fixed sense current of 0.5 mA is used as the sense line current established through the storage line structure between the end terminal regions thereof flowing through each of those bit structures in that storage line structure. This known current, along with the measured voltage across the cell (or the storage line structure) provides the resistance of the cell.

The characteristic, 30, having the peak on the left in FIG. 3 develops from initially having a sufficiently large magnetic field parallel to the easy axis (shown as a positive field on the plot) applied via current in the adjacent word line 22 to force the magnetizations in each of the ferromagnetic thin-films 12, 13 and 13',12' in the memory cell or bit structure 17 to be oriented in the direction of the field. These magnetizations will thus be parallel to one another pointing in an initial common direction to thereby leave the electrical resistance of the cell at a minimum (here, approximately 67.7 $\Omega$). This initial condition is followed by continually reducing this field toward zero and then reversing the field direction, after which the magnitude of the field is continually increased (shown as a negative field on the plot). As can be seen in the plot, this action begins to increase the resistance of the cell as the magnetization of thinner layer 13',12' begins to rotate toward the opposite direction at a greater angular rate than does the magnetization of thicker layer 12, 13. As a result, these magnetizations begin to be directed more and more away from one another as the field gets increasingly negative, thereby increasing the cell resistance, until the magnetization of the thinner layer is rotated just past 90° from the easy axis, whereupon it abruptly switches (at approximately $-7$ Oe) to being significantly directed in the opposite direction from that of the thicker layer as it attempts to align with the word line current generated field. At that point, the resistance value correspondingly increases abruptly to the peak value shown of approximately 72 $\Omega$.

As memory cells 17 are fabricated sufficiently small to be considered as having the composite layer ferromagnetic thin-films used therein to be single magnetic domain structures, the critical magnetic field magnitude ($-7$ Oe), or threshold, for the thinner layer at which such switching occurs (a threshold found much like the well known Stoner-Wohlfarth threshold which is defined for larger area films not subject to exchange coupling and edge effects) is determined from layer magnetic energy considerations including the magnitude of the magnetic field established by the sense current in addition to that established by the word line current. Further magnitude increases of the negative field do not, however, cause the magnetization of the thicker layer to switch to being directed in the opposite direction at the expected Stoner-Wohlfarth threshold therefor because the previous switching of the magnetization direction of the thinner layer inhibits the switching of the magnetization of the thicker layer. The change in the direction of magnetic field occurring in the thicker layer due to the magnetization of the thinner layer coupled thereto, because of having been previously switched in direction, acts against the switching of the magnetization of the thicker layer to effectively increase its switching threshold.

The magnitude of the magnetic field in the thicker layer due to the magnetization of the thinner layer (and vice verse) depends on the demagnetization fields in these layers, thus allowing, by selecting the sense current magnitude and the memory cell geometry to achieve an appropriate demagnetization factor value, the setting of the degree of switching inhibition. That is, the width of the peak in characteristic 30 can effectively be set by the cell design and operating conditions. Once this elevated magnitude threshold value (approximately $-70$ Oe) for the thicker layer is exceeded by the magnitude of the applied magnetic field to force its magnetization direction past 90° from the easy axis, the magnetization of this layer also switches to result in the magnetizations of the two ferromagnetic thin-film layers again being oriented in a common direction (although opposite to the initial direction) to thereby sharply lower the resistance value from the peak value of approximately 72 Ω to the relatively lower value shown of again about 67.7 Ω. Further increases in the magnitude of the negative field do not significantly further change the resistance value as the magnetization directions in each layer are forced slightly closer and closer to a common direction. Since the direction of magnetization of thicker layer 12,13 can only be switched by fields having magnitudes greater than those that switch the magnetization direction of thinner layer 13', 12', the direction of magnetization of thicker layer 12,13 effectively determines the binary value, "0"or "1", of the data bit stored in the cell.

Hence, traversing this large portion of characteristic 30 shown in FIG. 3 by changing the externally applied magnetic field due to word line current from a relatively large positive magnitude to a relatively large negative magnitude in the presence of a sufficient sense line current is equivalent to changing the magnetic state of both layers from pointing in one direction to pointing in the opposite direction, i.e. to storing a new data bit by changing the previously stored data therein based on the direction of the magnetization from its initial direction and binary value to another direction and value. If the initially stored data bit value was the same as the new value to be stored, the corresponding increase in the externally applied field magnitude in the opposite direction to store this new data bit, i.e. the increasing of the field in a positive direction rather than in the negative direction as described above, would not cause traversing the peak in characteristic 30 thus leaving the layer magnetizations direction and the data bit value unchanged.

The remaining characteristic, 31, in FIG. 3 develops just as did characteristic 30 if started from where the development of characteristic 30 terminated as described above, that is, by applying a positively increasing magnitude field in the presence of a sufficient sense current based field magnitude after the occurrence of a large magnitude negative field. Again, the peak in the cell resistance arises in this characteristic by first encountering a threshold like and near to a Stoner-Wohlfarth threshold for switching thinner ferromagnetic layer 13',12' (approximately 8 Oe) to increase the cell resistance from again about 67.7 Ω to around 72 Ω, and thereafter encountering the elevated magnitude threshold for switching thicker layer 12,13 (approximately 55 Oe) to decrease the cell resistance back to about 67.7 Ω. Thus, storing a data bit of either a "0" or a "1" binary value in a memory cell 17 having the characteristic shown in FIG. 3, as represented by the orientation direction of the magnetization of thicker layer 12,13 along its easy axis in the scheme just described, requires the application of a sufficient magnitude word line field in the corresponding direction along that axis in the presence of a sufficient magnitude sense field.

Retrieving the stored data without disrupting the value of that data is easily done in a memory cell or bit structure 17 having characteristics 30 and 31, the current one of these characteristics that the cell resistance will follow upon application of sense current and word line current based fields having been determined by the direction of orientation of the last external field applied to the cell sufficiently large to switch the magnetizations of both cell ferromagnetic thin-film layers in the presence the chosen sense current. A limited externally applied field (the limitations imposed by limiting the corresponding word line current and possibly the sense current) in the presence of the sense current chosen is initially provided having a value capable of placing the resistance of the cell at one of its peak values in either one or the other of characteristics 30 and 31, and the cell or storage line structure voltage measuring circuity is concurrently "autozeroed" to thereby measure a zero value in these circumstances. This initial field is limited in magnitude so as to be unable to switch the direction of magnetization of thicker layer 12,13 in the presence of the chosen sense current magnitude.

To complete retrieving the stored cell information, the limited externally applied field is then reversed from its initial direction to a final limited value in the opposite direction that is capable of placing the resistance of the cell at its other characteristic resistance peak, but not capable of switching the direction of magnetization of thicker layer 12,13 in the presence of the chosen sense current magnitude. If the cell resistance is actually at a resistance peak initially in following one of characteristics 30 or 31 because of the direction of the last previously applied word line current based field of a magnitude sufficient to switch magnetizations of both ferromagnetic layers, the resistance after the field reversal will decrease as the magnetization of the thinner layer switches to be oriented in the same direction as the direction of magnetization of the thicker layer. If the cell resistance is instead following the other characteristic so that it exhibits a relatively low resistance initially, the resistance after the field reversal will increase as the magnetization of the thinner layer switches to be oriented in the direction opposite to direction of the magnetization of the thicker layer.

Thus, the resistance change on the reversal from a field oriented in one direction of a magnitude limited to be at a resistance characteristic peak to a limited field oriented in the opposite direction will indicate which of the characteristics 30 and 31 the cell followed, and so in what direction the last sufficiently large externally applied magnetic field was oriented to thereby indicate the binary value of the data bit represented thereby. The change in the resistance value, $\Delta R$, is equal to the full change in resistance between the peak resistance value, representing the ferromagnetic layers magnetizations being opposed in direction to one another, to the relatively low resistance value representing the layer magnetizations being oriented in the same direction as one another. This retrieval process provides a bipolar output indication since an increase of this magnitude indicates one stored data bit value and a decrease indicates the opposite stored data bit value. Thus, the difference between the magnetic state indication represented by an increase in resistance, $+\Delta R$, and the magnetic state indication represented by a decrease in resistance, $-\Delta R$, is $+\Delta R - (-\Delta R) = 2\Delta R$, or twice the resistance change value to give the voltage measuring circuitry across the storage line structure a readily detectable and state differentiating output signal to measure from its "autozeroed" initial measuring point.

The above process for storing and retrieving data bits from memory cells just described can have the requirement therein for changing magnitudes of word line currents or sense currents, or both, alleviated by the addition of further structures to the memory. One alternative arrangement is to provide a further conductor over each storage line structure shown in FIGS. 1A and 1B but separated therefrom by an insulating layer, and also separated from the word lines thereabove. Such a conductor can have a current therein that will result in a biasing magnetic field being provided in the same direction perpendicular to the easy axis in each ferromagnetic layer in each memory cell in the corresponding storage line structure. This differs from the field established in those ferromagnetic layers by a sense current provided in the storage line structure through the memory cell leading to this sense current based field being oriented perpendicular to the easy axis but in opposite directions in each of the ferromagnetic layers in the memory cell. This occurs because that current flows substantially symmetrically above and below the vertical geometric center of that cell to create a magnetic field encircling it that is oriented in opposite directions above and below it. In this arrangement, cells could be selected for storing a data bit by coincident currents flowing in the cell word line and the cell bias line to select the cell where they crossed without having to rely during operation on the sense current or changing the word line current value for the next operation depending on whether a data bit storage or retrieval operation was to be undertaken.

Another alternative arrangement is to provide a meander word line for each storage line structure in the memory of FIGS. 1A and 1B such that the meander line, positioned above but separated from the word lines below by an insulating layer, parallels each word line crossing over that storage line structure. In such an arrangement, the meander line would start on one side of a memory cell below and cross over that cell to the other side thereof by paralleling the word line also crossing that cell. Once the meander line is so positioned crossing over the cell, rather than following the word line also therebelow any farther, the meander line would then have a right angle turn therein to thereby parallel the direction of extent of the storage line structure until the adjacent word line. Another right angle turn in the meander line would lead to the meander line paralleling this adjacent word line to cross over the adjacent memory cell in the storage line structure. Repeating this pattern leads to the meander line following the shape of approximately a square wave centered on the storage line axis of extent. Choosing the direction of current flow through the meander line appropriately would allow the generation of a meander field to aid the word lines fields. Again, coincident currents in a word line and the meander line would allow selecting the cell where they crossed without having to rely during operation on the sense current or changing the word line current value for the next operation depending on whether a data bit storage or retrieval operation was to be undertaken.

Characteristics 30 and 31 of FIG. 3, although typical, can and, as cells 17 decrease in size, do tend to have the peak portions thereof overlap more than is shown in FIG. 3. In the absence of externally applied fields, the degree to which the magnetizations in the ferromagnetic thin-film layers in a memory cell 17 are oriented in the same or opposite directions is determined by the values of the angles between the directions of magnetization in each layer and the easy axis of that layer that lead to the lowest free energy balance between the layer anisotropy energies, the layers exchange coupling energy and correlated surface waviness or textural variation coupling energy ("orange-peel coupling"), and energies of the interactions between the layer demagnetization fields and the layer magnetizations. While, as indicated above, the demagnetization energies can be significantly controlled by the cell geometry, the exchange energy is more variable. Although the exchange energy is very dependent on the separation of the two ferromagnetic layers in a memory cell 17, i.e. the thickness of the non-magnetic intermediate layer, this energy is also quite dependent on the nature of the surfaces between these ferromagnetic layers and the intermediate layer that result from the fabrication process.

Figure 4A:
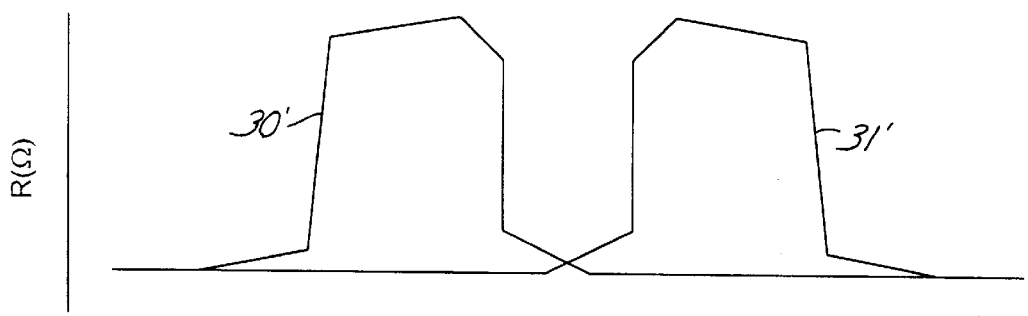
Figure 4B:
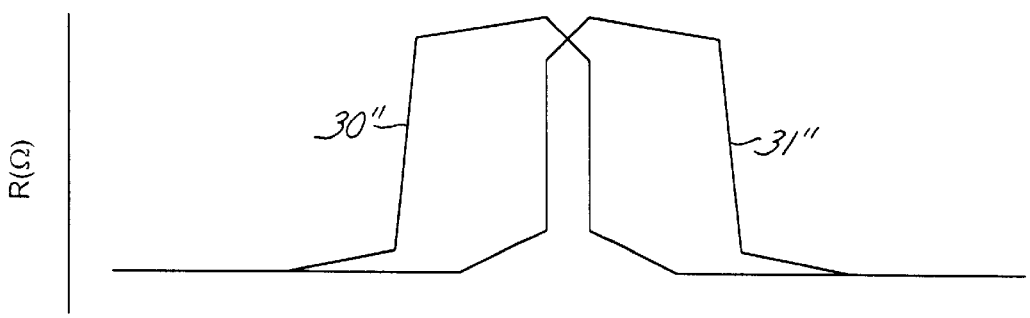

In FIG. 4A, a somewhat idealized representation is shown of magnetoresistance versus applied external field characteristics (with just enough sense current to permit measurement of these characteristics) for a memory cell 17 in which the exchange and surface textural variation coupling substantially prevails thereby tending to force the magnetizations in each layer toward pointing in the same direction. This situation leads to little or no overlap of the resistance peaks of each characteristic here designated 30' and 31'. In the characteristics, 30" and 31", shown in FIG. 4B, however, the demagnetization energies substantially prevail for the memory cell 17 represented leading to a significant overlap of the resistance peaks. As indicated above, the characteristics represented in FIG. 4B are the outcome of reducing the geometrical extent of bit structures or memory cells 17, and this occurs because of the increasing demagnetization fields resulting from magnetic material structures of smaller sizes (primarily due to shortened lengths). The above described data bit storage and retrieval processes operate satisfactorily in either circumstance shown in FIGS. 4A and 4B, as well as in the intermediate situation shown in FIG. 3.

Magnetic structures are known, from thermodynamic considerations, to have stable equilibrium states of magnetization at minimums of the free energies of those structures. The total free energy of a bit structure or memory cell 17 can be given generally as $$E_{Tot} = E_1 + E_2 + E_{12},$$

where the total free energy is represented by $E_{Tot}$, the self-energy of the first and second layers being represented by $E_1$ and $E_2$, respectively, and with the interaction energy between the two layers represented by $E_{12}$. As indicated above, a reasonable approximation for the structure of a bit structure 17 is to assume that the ferromagnetic thin-film layers therein are each of a single domain allowing the assumption that the magnetization of a layer changes only by rotation, and that these layers exhibit uniaxial anisotropy. These and further other reasonable approximations, such as assuming there is no magnetic energy at present due to magnetostriction or to other causes, allows an analytic representation of the behavior of a bit structure or memory cell 17 that rather closely matches the characteristics shown in FIGS. 3 and 4. The expressions provided for this purpose representing these energies will be based on the bit structure shown in FIG. 5A as taken from bit structures 17 shown in FIG. 1A.

The self-energy for this purpose of thicker ferromagnetic thin-film composite layer 12, 13, designated here as the first layer, can be represented as $$E_1 = \frac{H_{k1}M_{s1}V_1}{2}\sin^2(\theta_1) + \frac{D_{1L}M_{s1}^2V_1}{2}\sin^2(\theta_1) +$$

$$\frac{D_{1W}M_{s1}^2V_1}{2}\cos^2(\theta_1) + H_w M_{s1}V_1\cos(\theta_1) - (S_1 H_s - H_b)M_{s1}V_1\sin(\theta_1),$$

and the self-energy of thinner ferromagnetic thin-film composite layer 13', 12' considered the second layer can be similarly written as $$E_2 = \frac{H_{k2}M_{s2}V_2}{2}\sin^2(\theta_2) + \frac{D_{2L}M_{s2}^2V_2}{2}\sin^2(\theta_2) +$$

$$\frac{D_{2W}M_{s2}^2V_2}{2}\cos^2(\theta_2) + H_w M_{s2}V_2\cos(\theta_2) - (S_2 H_s + H_b)M_{s2}V_2\sin(\theta_2).$$

The first term in each of these self-energy expressions represents the anisotropy energy in the corresponding one of the layers due to the anisotropies present therein, primarily the anisotropy brought about by the deposition of these ferromagnetic films in the presence of a magnetic field leading to requiring energy to deviate the magnetization of the film from the easy axis therein established by such deposition. The effects of such anisotropies are cumulatively represented in a well known manner by an effective anisotropy field in each layer, $H_{k1}$ and $H_{k2}$, respectively, multiplied by the saturation magnetization of that layer which is $M_{s1}$ for layer 1 and is $M_{s2}$ for layer 2. The angle between the magnetization of the first layer, $M_1$, shown by a dashed line vector in FIG. 5A, and its easy axis is represented by $\theta_1$. The angle between the magnetization of the second layer, $M_2$, shown by a solid line vector in that figure, and its easy axis is represented by $\theta_2$. The volume of each layer, $V_1$ for layer 1 and $V_2$ for layer 2, multiply the respective terms to give the total anisotropy energy in each corresponding layer.

The second and third terms in each of the last two energy expressions represent the demagnetization self-energy for each of the corresponding layers in a form typically written therefor. In these terms, the symbols $D_{1L}$ and $D_{2L}$ each represent the demagnetization factor corresponding to the length axis for the pertinent one of the first and second ferromagnetic thin-film layers in bit structure 17. The symbols $D_{1W}$ and $D_{2W}$ in these terms each represent the demagnetization factors corresponding to the width axis for the related layer.

Figure 5A:
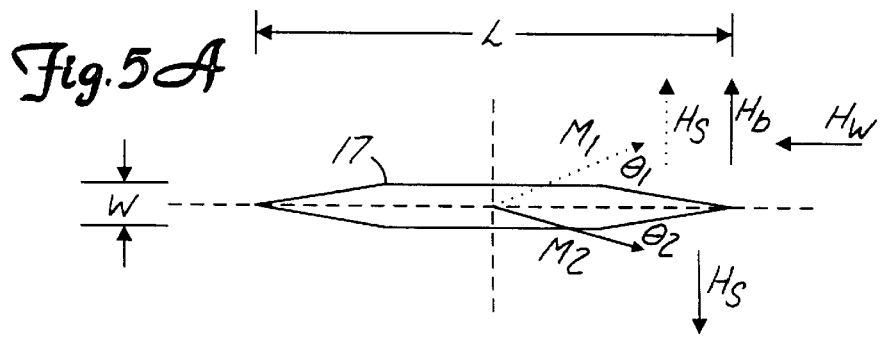

The fourth terms of each of these expressions represent the energy of the magnetization in the corresponding layer due to the current applied in the associated word line 22 to generate a magnetic field, $H_w$, shown directed from right to left in FIG. 5A. Should a meander word line as described above be used, the field contribution from current in that line would be merely added to, and part of, the field $H_w$ supplied by the current through word line 22 over the corresponding bit structure 17.

The last term in each of these expressions represents the energy of the magnetization in the corresponding layer due to the applied sense current flowing from end to end through bit structure 17 as part of a storage line structure to generate a field, $H_s$. In FIG. 5A, that field is shown by a dashed line arrow pointing upward for layer 1 of the bit structure 17 shown there, and by a solid arrow pointing downward for layer 2 in that structure assuming a current flow through the structure from left to right. A symmetry factor for each layer, $S_1$ and $S_2$, multiplies the sense field $H_s$ to account for the asymmetry in the situation of each of the layers 1 and 2 resulting from their different structures and locations in the bit structure. A further term is provided for a field generated by the use of a bias line over the storage line structure carrying a current as described above, this field being designated by $H_b$ and represented in FIG. 5A by an upward pointing solid line arrow assuming current flow in that bias line is from left to right should such a bias line be used.

The interaction energy between the two ferromagnetic thin-film layers in a bit structure or memory cell 17 is given by $$E_{12} = -H_e V_{avg} M_{s-avg} \cos(\theta_1 - \theta_2) - \frac{V_1 D_{2W} + V_2 D_{1W}}{2} M_{s1} M_{s2} \sin(\theta_1)\sin(\theta_2) + \frac{V_1 D_{2L} + V_2 D_{1L}}{2} M_{s1} M_{s2} \cos(\theta_1)\cos(\theta_2).$$

The first term in this interaction energy expression accounts for the exchange coupling energy and the correlated surface waviness (textural variation) coupling energy which is represented by an effective exchange field, $H_e$, in the usual manner to cover these couplings between the ferromagnetic thin-film layers. This term is multiplied by the average volume and magnetization of both of these layers, or $$V_{avg} = \frac{V_1 + V_2}{2},$$

$$M_{s-avg} = \frac{M_{s1} T_1 + M_{s2} T_2}{T_1 + T_2}.$$

The last two terms in the ferromagnetic layer interaction energy expression represent the effects of the magnetization in one layer upon the magnetization in the other layer, in an interaction analogous to the well known dipole-dipole interaction through considering the magnetization in each layer as a dipole interacting with the magnetization in the other. Because of the extremely close proximity of the two ferromagnetic layers, the effective field in one layer due to the demagnetization field in the other is taken to be identical to that source demagnetization field, ignoring any effects of the separation. These terms are responsible for the switching inhibition described above (and some rotation aiding) leading to the elevated magnitude threshold faced in switching the direction of magnetization of thicker ferromagnetic layer 12,13 when the magnetization of thinner layer 13',12' is directed oppositely to that of the thicker layer.

Figure 5B:
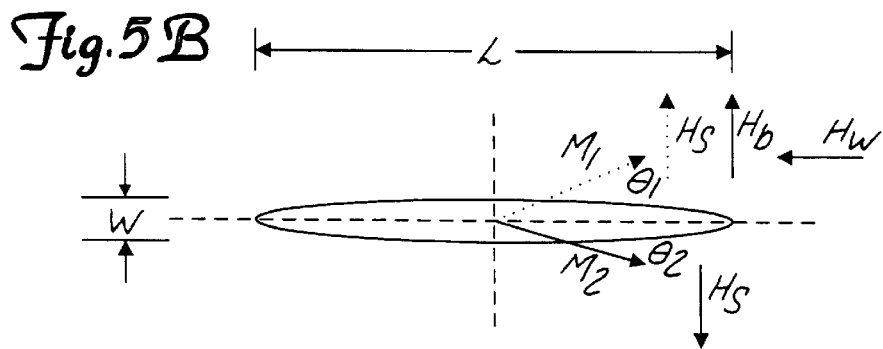

Ferromagnetic material masses of general shapes in a magnetic field lead to very complex demagnetization factors characterizing the internal response of that mass to the field. Homogeneous bodies having surfaces characterizable by expressions in the second degree lead to demagnetization factors in uniform fields which are much more tractable, i.e. the magnetization factors for ellipsoids have been determined in analytical closed form. As can be seen in FIG. 5B, an ellipsoid can be provided with corresponding ones of its axes numerically equal to the length, width and thickness of the ferromagnetic thin-film layers in bit structure 17 of FIG. 5A. The resulting ellipsoid can be seen to rather closely approximate those layers in viewing FIGS. 5A and 5B together, at least for thinner composite ferromagnetic layer 13', 12' exposed in FIG. 5A. However, the length and width of thicker ferromagnetic composite thin-film layer 12,13 is the same as that of layer 13',12' and the thickness differences between the two layers are easily accounted for by the different dimensions of the third axis of the ellipsoids used to represent them to reflect the difference between the thicknesses of those layers. The resulting demagnetization factors are $$D_{1L} = \frac{4\pi \cos(\phi)\cos(\zeta_1)}{\sin^3(\zeta_1)\sin^2(\alpha_1)}[F(k_1, \zeta_1) - E(k_1, \zeta_1)]$$

and $$D_{2L} = \frac{4\pi \cos(\phi)\cos(\zeta_2)}{\sin^3(\zeta_2)\sin^2(\alpha_2)}[F(k_2, \zeta_2) - E(k_2, \zeta_2)]$$

for the demagnetization factors corresponding to the lengths of the ellipsoids representing the two ferromagnetic thin-film layers of memory cell 17 in FIG. 5A, and $$D_{1W} = \frac{4\pi \cos(\phi)\cos(\zeta_1)}{\sin^3(\zeta_1)\sin^2(\alpha_1)\cos^2(\alpha_1)} \times$$
$$\left[ E(k_1, \zeta_1) - \cos^2(\alpha_1)F(k_1, \zeta_1) - \frac{\sin^2(\alpha_1)\sin(\zeta_1)\cos(\zeta_1)}{\cos(\phi)} \right]$$

and $$D_{2W} = \frac{4\pi \cos(\phi)\cos(\zeta_2)}{\sin^3(\zeta_2)\sin^2(\alpha_2)\cos^2(\alpha_2)} \times$$
$$\left[ E(k_2, \zeta_2) - \cos^2(\alpha_2)F(k_2, \zeta_2) - \frac{\sin^2(\alpha_2)\sin(\zeta_2)\cos(\zeta_2)}{\cos(\phi)} \right]$$

for the demagnetization factors corresponding to the widths of these ellipsoids for these layers.

In these equations for the demagnetization factors, the various trigonometric terms, $\cos(\phi)$, $\cos(\xi_x)$, and $\sin(\alpha_x)$, are defined as $$\cos(\phi) = \frac{W}{L} \quad \left(0 \le \phi \le \frac{\pi}{2}\right),$$

$$\cos(\zeta_x) = \frac{T_x}{L} \quad \left(0 \le \zeta_x \le \frac{\pi}{2}\right),$$

and $$\sin(\alpha_x) = \left[\frac{1-\left(\frac{W}{L}\right)^2}{1-\left(\frac{T_x}{L}\right)^2}\right]^{\frac{1}{2}} = \frac{\sin(\phi)}{\sin(\zeta_x)} = k_x \quad \left(0 \le \alpha_x \le \frac{\pi}{2}\right),$$

where L is the length of the ellipsoid, W is the width of the ellipsoid, and $T_x$ represents the thicknesses of either of the two approximating ellipsoids through x being set to either 1 or 2 to indicate the first or second layer. The functions denoted by $F(k_x, \xi_x)$ and $E(k_x, \xi_x)$ are elliptic integrals of the first kind and the second kind, respectively, defined as $$F(k_x, \zeta_x) = \int_0^{\zeta_x} \frac{1}{\sqrt{1-k_x^2\sin^2(\psi)}} d\psi$$

and $$E(k_x, \zeta_x) = \int_0^{\zeta_x} \sqrt{1-k_x^2\sin^2(\psi)}\, d\psi.$$

These expressions for the demagnetization factors can be further simplified in several situations, including the present situation where the length and width are of comparable magnitudes but each are more than an order of magnitude greater than the thickness, i.e.

$$L \ge W > T_x.$$

In this circumstance, the demagnetization factors can be expressed as $$D_{1L} \approx 4\pi T_1 \frac{(1-e^2)^{\frac{1}{2}}}{L} \frac{K-E_c}{e^2} = 4\pi T_1 F_L$$

and $$D_{2L} \approx 4\pi T_2 \frac{(1-e^2)^{\frac{1}{2}}}{L} \frac{K-E_c}{e^2} = 4\pi T_2 F_L$$

for the demagnetization factors corresponding to the lengths of the ellipsoids representing the corresponding one of the two ferromagnetic layers, and $$D_{1W} \approx 4\pi T_1 \frac{E_c - (1-e^2)K}{Le^2(1-e^2)^{\frac{1}{2}}} = 4\pi T_1 F_W$$

and $$D_{2W} \approx 4\pi T_2 \frac{E_c - (1-e^2)K}{Le^2(1-e^2)^{\frac{1}{2}}} = 4\pi T_2 F_W$$

for the demagnetization factors corresponding to the widths of these ellipsoids representing those layers. In these last equations for the demagnetization factors, the symbol e is defined as $$e = \left(1 - \frac{W^2}{L^2}\right)^{\frac{1}{2}}.$$

The functions K and $E_c$ are complete elliptic integrals given as $$K = \int_0^{\frac{\pi}{2}} \frac{1}{\sqrt{1-e^2\sin^2(\psi)}} d\psi$$

and $$E_c = \int_0^{\frac{\pi}{2}} \sqrt{1-e^2\sin^2(\psi)}\, d\psi.$$

Using these last expressions for the demagnetization factors, the above expressions for the energy components in the free energy of the bit structures 17 of FIG. 5A can be rewritten in simplified form. The self-energy of ferromagnetic thin-film layer 12,13 becomes $$E_1 = $$
$$\frac{H_{k1}M_{s1}V_1}{2}\sin^2(\theta_1) + \frac{4\pi T_1 F_L M_{s1}^2 V_1}{2}\sin^2(\theta_1) + \frac{4\pi T_1 F_W M_{s1}^2 V_1}{2}\cos^2(\theta_1) +$$
$$H_w M_{s1} V_1 \cos(\theta_1) - (S_1 H_s - H_b)M_{s1}V_1\sin(\theta_1).$$

The expression for the self-energy of layer 13',12' now is $$E_2 =$$
$$\frac{H_{k2}M_{s2}V_2}{2}\sin^2(\theta_2) + \frac{4\pi T_2 F_L M_{s2}^2 V_2}{2}\sin^2(\theta_2) + \frac{4\pi T_2 F_W M_{s2}^2 V_2}{2}\cos^2(\theta_2) +$$
$$H_w M_{s2} V_2 \cos(\theta_2) - (S_2 H_s - H_b)M_{s2}V_2\sin(\theta_2).$$

Finally, the interaction energy expression becomes $$E_{12} = -H_e V_{avg} M_{s-avg} \cos(\theta_1 + \theta_2) -$$
$$\frac{V_1 4\pi T_2 F_W + V_2 4\pi T_1 F_W}{2} M_{s1} M_{s2} \sin(\theta_1)\sin(\theta_2) +$$
$$\frac{V_1 4\pi T_2 F_L + V_2 4\pi T_1 F_L}{2} M_{s1} M_{s2} \cos(\theta_1)\cos(\theta_2)$$

or

-continued $$E_{12} = -H_e V_{avg} M_{s-avg} \cos(\theta_1 + \theta_2) - \frac{V_1 T_2 + V_2 T_1}{2} 4\pi F_W M_{s1} M_{s2} \sin(\theta_1)\sin(\theta_2) + \frac{V_1 T_2 + V_2 T_1}{2} 4\pi F_L M_{s1} M_{s2} \cos(\theta_1)\cos(\theta_2).$$

In the absence of any applied fields, including any applied word line fields or fields due to a sense current or a bias current, the last energy equations can be rewritten to represent the internal energy situation of the bit structure, or $$E_{Tot-int} = E_{1-int} + E_{2-int} + E_{12}$$

where the "int" in subscripts means internal and its omission in the last term means that the interaction energy is unchanged in the absence of externally applied fields. These equations can then be minimized to find the angles at which the magnetizations and the two layers lie with respect to each other to result in balancing the anisotropy energies of the layers, the self-energies of the layers and the interaction energy between the layers. The result determines the amount of overlap of the two resistance characteristics of the bit structure at the zero word line field point, there having been two examples of different overlaps in the resistance characteristics as shown in FIGS. 4A and 4B. These equations, as rewritten for this purpose and assuming a very small sense current being used just sufficient to allow measurement without a significant impact on the fields, are $$E_{1-int} = \frac{H_{k1} M_{s1} V_1}{2}\sin^2(\theta_1) + \frac{4\pi T_1 F_L M_{s1}^2 V_1}{2}\sin^2(\theta_1) + \frac{4\pi T_1 F_W M_{s1}^2 V_1}{2}\cos^2(\theta_1)$$

and $$E_{2-int} = \frac{H_{k2} M_{s2} V_2}{2}\sin^2(\theta_2) + \frac{4\pi T_2 F_L M_{s2}^2 V_2}{2}\sin^2(\theta_2) + \frac{4\pi T_2 F_W M_{s2}^2 V_2}{2}\cos^2(\theta_2).$$

The equation for the interaction energy given previously is used with these last two equations to together represent the total internal energy $E_{Tot-int}$.

Some limitations must be satisfied by bit structures 17 to have them behave during digital data storage and retrieval operations as desired. The width dimension W thereof is subject to at least two conditions which limit its extent to being less than certain values. As indicated above in describing the operating process, the switching of the directions of the magnetizations of the layers at certain threshold values of the word line current based fields depends on the magnitude of the sense fields due to the sense current since these sense fields affect those thresholds. The ability of the fields generated by the sense currents to affect the thresholds will be diminished and eventually disappear (or become negligibly small) as the width dimension of bit structure 17 become increasingly wide. This begins to occur when the width of the bit structure exceeds twice the curling length experienced in that structure for the magnitude of the word line current based field used for switching the directions of the layer magnetizations.

The magnetizations of portions near the sides of a bit structure 17 are pinned there in a direction parallel to the sides to a greater extent than those in the interior of the structure because of demagnetization considerations. Thus, as the structure widens, the applied field will at some point switch the magnetization of the layers in the interior central portions thereof without having switched the magnetizations of the layer portions near the edges thereof. As a result, the fields due to the sense current, which are orthogonal in direction to those induced by the word line currents, tend to interact with the magnetizations of the ferromagnetic layers in two counteracting ways rather than in one supporting way. That is, the fields due to the sense current will cause torques on the magnetizations already rotated in the central interior portions in one direction, but cause torques on the magnetizations at the edges in an opposite direction to thereby in effect cancel out the torques on the magnetizations. The intent is instead to have the torques generated by the sense current fields act in a common direction to aid the switching of the magnetizations under the applied word line current fields. Hence, the width of bit structure 17 should be no greater than twice such curling lengths occurring therein from its sides inward. If the width of a bit structure 17 is less than twice the curling length's characteristic thereof, the magnetizations of the layers, both in the central interior portions and near the outer side portions thereof, rotate together and so are subject to torques from the field generated by the sense current in a common direction.

On the other hand, the sense current can be kept sufficiently small so as not to be a significant factor in determining the magnetization direction switching thresholds, particularly when a meander word line as described above is used. In any event, suitable operation of bit structure 17 as described above requires that demagnetizing fields be of sufficient magnitude to serve to inhibit the switching of the thicker ferromagnetic thin-film layer magnetization once the magnetization of the thinner layer has already been oppositely directed as described above. This inhibition is due primarily to the demagnetizing field components that parallel the width dimension of bit structure 17 since these demagnetizing fields will be considerably greater in magnitude than those along the length of that structure given that the width has significantly smaller extent than does the length. To assure that the demagnetizing fields associated with the width are dominant with respect to the anisotropy fields occurring in the layers, a bit structure 17 is required to have a width sufficiently small to result in the width component demagnetization field being larger than the anisotropy field for the layer, or that $H_{dx}$, representing the demagnetization field along the widths, be greater than $H_{kx}$ leading to $$H_{dx} = D_{xW} M_{sx} \approx 4\pi T_x F_W M_{sx} > H_{kx}$$

This inequality then yields $$F_W > \frac{H_{kx}}{4\pi T_x M_{sx}},$$

or $$\frac{E_c - (1-e^2)K}{Le^2(1-e^2)^{\frac{1}{2}}} > \frac{H_{kx}}{4\pi T_x M_{sx}}.$$

Since K and $E_c$ do not vary much in value with decreasing values of e, the ratio of the width to the length must be kept sufficiently small such that the $(1-e^2)^{1/2}$ factor in the denominator on the left side of the inequality is small enough to make the inequality hold for the choice of thickness of the corresponding ferromagnetic layer material chosen, this material having a particular anisotropy field $H_{kx}$ and a particular saturation magnetization $M_{sx}$.

Aside from its effect on the ratio of width to length in the last equality, there are no significant further limitations on the length of a bit structure 17 beyond practicality limitations. One such limitation is that the need to provide a fairly uniform word line current based magnetic field across a bit structure 17 requires that the word line be approximately as wide as that bit structure. For a desired magnitude of the field generated by the word line current, that current necessary to provide that field magnitude becomes proportional to the width of the word line, that is, equivalently, to the length of the bit structure 17. Thus, there is not only a desire to keep the bit length short to allow as many as possible to be provided in the digital memory to improve its density of storage, there is also a desire to keep the word line currents as small as possible to reduce the heat dissipation in the monolithic integrated circuit which also, as just indicated, requires keeping the bit structure lengths relatively short.

A further limitation which is related to both the length and the width of a bit structure 17 comes about in connection with the overlap of bit juncture 20 over the ends of those adjacent bit structures 17 interconnected thereby. If the electrically conductive metal of a bit juncture 20 extends too far along the length of a bit structure 17 in interconnecting it into the storage line structure, a magnetic domain wall can occur in the ferromagnetic layers under the overlap area to thereby result in that bit structure having one or both ferromagnetic layers in a multiple magnetic domain state rather than a single domain state thereby leading to erratic switching threshold behavior. In layers formed of typical ferromagnetic thin-film materials with typical parameters, such "pseudo" Néel ferromagnetic layer walls in these layers are typically 0.1 to 0.3 $\mu$m wide, and are tilted at an approximately 45° angle. Thus, the overlap region along the length of the bit structure should be less than the width of that bit structure plus two such wall widths. In a 0.4 $\mu$m wide bit structure with ferromagnetic thin-film layers 60 Å thick, the overlap region would then be required to be less than 1.0 $\mu$m.

A final limitation on bit structure 17 is related to the required difference in thicknesses between thicker composite ferromagnetic thin-film layer 12,13 and thinner layer 13',12'. An insufficient difference in thickness between these two layers in the face of high rate of applied magnetic field changes, such as results from the use of an abrupt change in current in the word lines to generate such field changes, can lead to switching the direction of magnetization in both layers concurrently even though just one of them was intended to be switched. That is, if the difference in thickness between the layers, and so the difference in magnetization therebetween, is not sufficiently large, the direction of magnetization in each of these layers will switch together even if the magnitude intended for the switching field is only slightly larger than the switching threshold value of the thinner layer should the change in that field be applied at a high enough rate. Such high rates of application will result from the typical changes in word line current values resulting from transistor switches being switched off and on which often result in the current change approximating a step function.

Since the behavior of the magnetization in the ferromagnetic layers of a bit structure in response to a sharply changing magnetic field is of present concern, the equations of motion for the magnetizations in the ferromagnetic layers in response to changes in magnetic fields are pertinent. Suitable equations of motion are found to relate the time rate of change of the magnetization to the torque applied to that magnetization by all of the magnetic fields present plus some damping of that motion. A well known equation expressing this relationship, based on choosing a certain form of such damping, is the Gilbert equation or $$\frac{d}{dt}\vec{M} = \gamma\left(\vec{M} \times \vec{H}\right) - \frac{\alpha}{M_s}\left(\vec{M} \times \frac{d}{dt}\vec{M}\right).$$

Here, the magnetization is shown as a vector, $\vec{M}$, as is the total magnetic field applied to the magnetization, $\vec{H}$. The symbol $\gamma$ is the gyromagnetic ratio, and the symbol $\alpha$ is the damping constant which will be quite small, typically 0.02.

Expressing this vector equation in its components represented in spherical coordinates results in the following coupled system of first order differential equations (for thin-films with magnetizations constrained by vertical demagnetizing fields to essentially lie in the plane of the film)

$$\frac{d}{dt}\theta = -\frac{4\pi M_s|\gamma|}{1+\alpha^2}\phi + \frac{|\gamma|\alpha}{M_s(1+\alpha^2)}\tau,$$

and $$\frac{d}{dt}\phi = -\frac{4\pi M_s \alpha|\gamma|}{1+\alpha^2}\phi + \frac{|\gamma|}{M_s(1+\alpha^2)}\tau.$$

Here, $\theta$ is the azimuthal angle (or ferromagnetic layer in-plane angle) and $\phi$ is the polar angle (or ferromagnetic layer out of plane angle) in spherical coordinates. The symbol $\tau$ represents the torque effectively applied as a result of the magnetic fields present.

Figure 6:
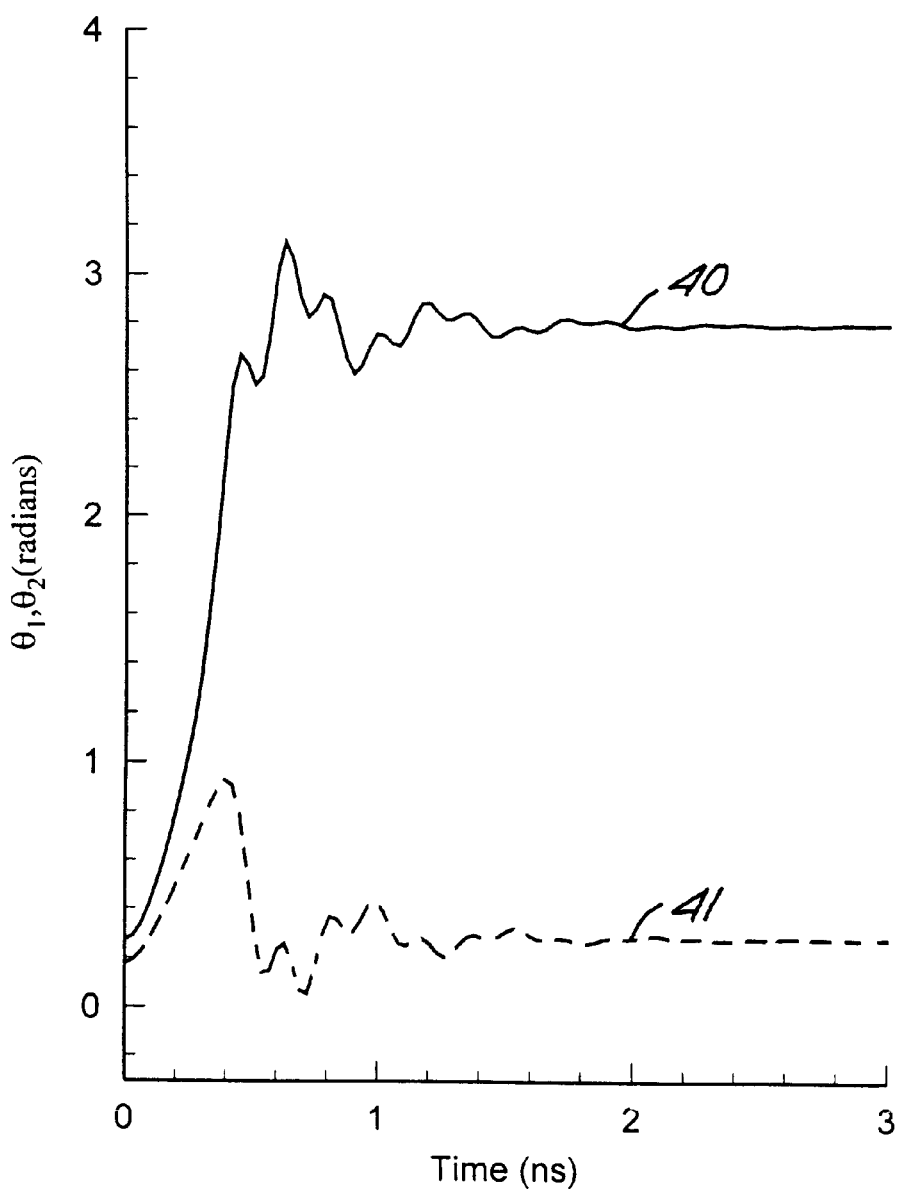
FIG. 6 shows a graph of responses for a structure similar to one of those shown in FIGS. 1A, 1B and 2, and FIGS. 7A and 7B show graphs of characteristics for a structure similar to one of those shown in FIGS. 1A, 1B and 2.

The response of the magnetizations of the thinner and thicker ferromagnetic thin-films in a bit structure 17 to the dynamic application of torques via the magnetic fields generated by the associated word line currents can be found from these latter equations. FIG. 6 shows a graph of the rotational angular responses of the magnetizations to a word line current generated torque shifting abruptly from zero to a value of about 30 Oe. The lower coercivity thinner layer 13',12' is represented by an upper plot, 40, on that graph showing how it is more responsive to the applied torque than is the higher coercivity, thicker layer 12,13 represented by the lower plot designated 41. This upper plot is shown with the thinner layer magnetization having rotated in response to an angle from the easy axis of about $\pi$ radians, and so this plot reflects that the direction of the magnetization is switched in that layer due to the application of the word line current generated field.

Notice that there is a substantial oscillation in the angular position of this magnetization vector in reaching its final angular value as seen in plot 40. Although this oscillation, or "ringing", in the response of the magnetization of the thinner ferromagnetic layer to the step function in the word line field is relatively inconsequential to the operation of the device, a similar "ringing" occurs in the rotational angular behavior of the magnetization vector of the thicker layer as seen in plot 41 which can be of much more significance. The largest peak in the "ringing" portion of the lower plot reaches an angular value that is more than twice the angular value of the final angular position taken by the thicker layer magnetization as a result of the applied step function word line current change and the aiding effect of the magnetization angular position change in the thinner layer (up to the point of switching the magnetization direction in that layer).

Although not a problem for the bit structure represented in FIG. 6 because the switching of the magnetization direction in the thinner layer immediately thereafter begins to inhibit the angular positional change of the magnetization of the thicker layer before it reaches π/2 radians, in some bit structures having too small a difference between the thicknesses of the ferromagnetic thin films or too small a sense current, or both, this initial peak in the "ringing" could reach the π/2 radian value. At that point, the thicker ferromagnetic layer switches the direction of its magnetization more or less concurrently with the switch in the direction of the magnetization of the thinner layer even though the ultimate final value intended for the angle of rotation of the magnetization of the thicker layer in response to the step function word line current change was less than π/2 radians. That is, a word line current step function could be applied with the intention of switching the direction of magnetization of the thinner ferromagnetic layer but not that of the thicker layer, but nevertheless result in switching the directions of magnetizations of both layers because of the peak in the "ringing" portion of the response of the magnetization of the thicker layer to the applied field.

Figure 7B:
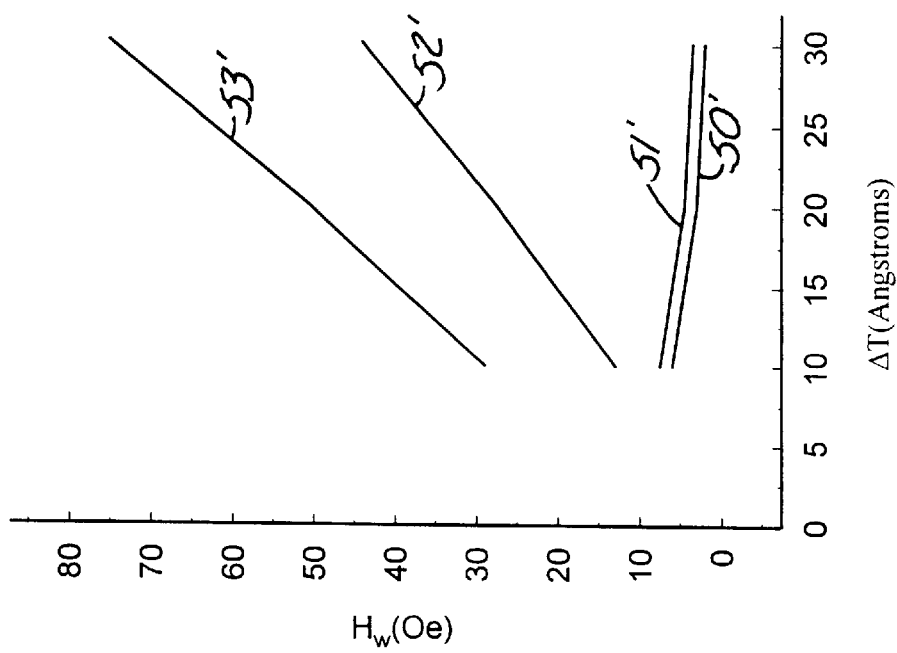
Figure 7A:
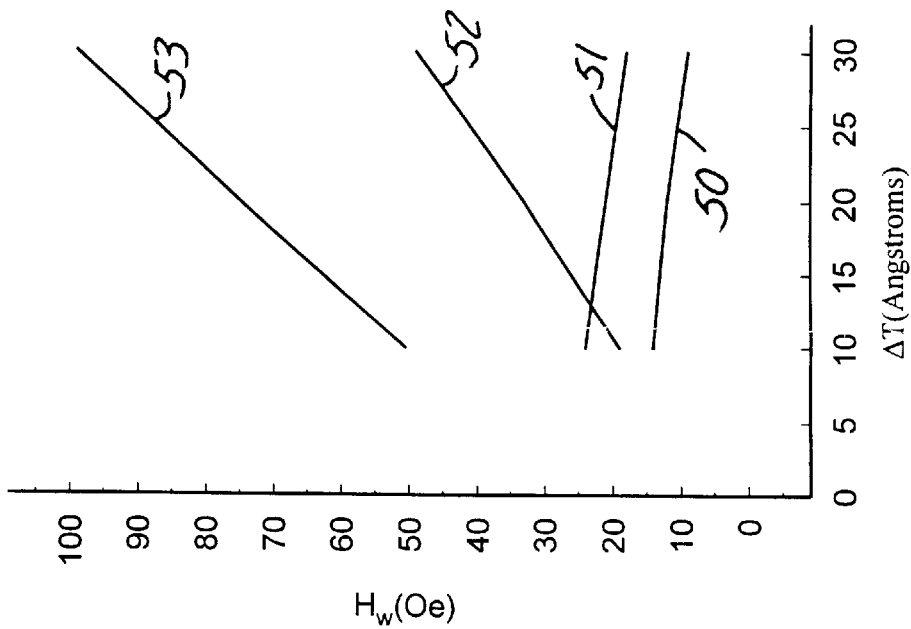

The implications of this dynamic behavior of the rotating magnetizations of the thinner or thicker ferromagnetic thin-films in bit structure 17 can be seen in FIGS. 7A and 7B. In these figures, the dynamic thresholds are plotted as opposed to the quasi-static thresholds which result from minimizing the foregoing energy equations without regard to the dynamic behavior of the structure during operation. The quasi-static thresholds would be from 10% to 15% greater than the dynamic switching thresholds shown in FIGS. 7A and 7B. These switching thresholds are all found on the basis of using the highest rate of change in the effectively applied torque, that is, they are the thresholds which result from a step-function change in the word line current. A sense current is provided resulting in a sense field of 15 Oe.

The lowest threshold, 50, represents the switching threshold for thinner layer 13',12' when both the magnetization thereof, and of the thicker layer, have not yet been switched to a direction that is the same as the direction of the applied word line field. The next greater switching threshold, 51, is also for the thinner ferromagnetic thin-film layer, but with the thicker layer having its direction of magnetization matching that of the applied word line field. As can be seen, the magnetization of the thicker layer in this instance has inhibited the rotation of the magnetization of the thinner layer to effectively raise the switching threshold for that thinner layer. In each instance, the thinner layer switching threshold is plotted as a function of the layer thickness difference but that layer has the same thickness of 40 Å for all the plots on this graph.

The next greater switching threshold shown, 52, is the dynamic threshold for thicker layer 12,13 when both this thicker layer and the thinner layer have the magnetizations thereof opposed to the direction of the applied word line field. As a result, there is no inhibiting effect from the magnetization of the thin layer on the magnetization change of the thicker layer so that both switch as a result of the applied field. However, switching threshold 52 is shown as a function of increasing thickness of the thicker layer to thereby result in an increasing thickness difference between the thicker and the thinner layer. Clearly, the switching threshold increases significantly for the thicker layer as the difference of thicknesses in the two layers increases. The final switching characteristic, 53, represents the situation in which the thinner layer is already switched to be directed in the same direction as the applied word line field so as to inhibit the switching of the magnetization of the thicker layer. Again, switching characteristic 53 is plotted as a function of the increasing thickness difference between the layers.

As can be seen, the dynamic switching threshold plots for the thinner layer cross the dynamic switching threshold plots for the thicker layer as the thickness differences between the two layers sufficiently decrease. In this situation, there is clearly a substantial risk of having the directions of magnetization in both the thicker and thinner layer switch together in response to the application of a step function change in the word line current. As the thickness difference between the layers increases, an increasing gap develops between the switching thresholds for the thinner layer and the switching thresholds for the thicker layer thus providing a margin of safety in avoiding the switching of the thicker layer in response to a step-function change in the word line current intended to switch only the direction of the magnetization of the thinner layer.

FIG. 7B shows dynamic switching thresholds of the same nature as those shown in FIG. 7A except they are found in connection with the use of a greater sense current, so in FIG. 7B the threshold designation numerals matching those used in FIG. 7A are followed by a prime mark to result in being designated 51', 52', 53' and 54'. Switching thresholds in FIG. 7B are established on the basis of a greater sense current, here providing the field of 25 Oe, as compared to the sense current used in finding the switching thresholds shown in FIG. 7A where the sense current field was only 15 Oe. Clearly, the use of a larger magnitude sense current results in a greater safety margin at lower thickness differences between the thinner layer switching thresholds and the thicker layer switching thresholds.

Thus, the thickness difference between the ferromagnetic thin-films used in a bit structure 17 must be sufficiently great, for the magnitude of the sense current and the structure geometrical parameters used, to assure that the application of a word line field intended to switch the thinner layer does not also have the effect of an unintended switching of the thicker layer also. In many situations, the thickness difference between the ferromagnetic thin-film layers will need to exceed at least 10% of the average of these two thicknesses.

The energy equations above, based on the ellipsoidal approximations described there for bit structure 17 meeting the foregoing limitations, can be minimized to find the equilibrium angular positions of the ferromagnetic layer magnetizations as a function of the applied sense, bias and word line current generated fields, and to find the quasi-static field thresholds. Necessary conditions for such an energy minimum are $$\tau_1 = \frac{\partial}{\partial \theta_1} E_{Tot} = 0$$

and $$\tau_2 = \frac{\partial}{\partial \theta_2} E_{Tot} = 0.$$

Taking the derivative with respect to $\theta_1$ to find the torque $\tau_1$ and setting the result equal to zero as indicated in the equation for that torque above yields $$\tau_1 = [H_{k1}M_{s1} + 4\pi M_{s1}^2 T_1(F_L - F_W)]V_1\sin(\theta_1)\cos(\theta_1) - H_w M_{s1} V_1 \sin(\theta_1) -$$

$$(S_1 H_s - H_b)M_{s1} V_1 \cos(\theta_1) + H_e M_{s-avg} V_1 \frac{T_{avg}}{T_1}\sin(\theta_1 + \theta_2) -$$

$$T_2 4\pi F_W M_{s1} M_{s2} V_1 \cos(\theta_1)\sin(\theta_2) - T_2 4\pi F_L M_{s1} M_{s2} V_1 \sin(\theta_1)\cos(\theta_2)$$

$$= 0.$$

using $V_x = AT_x$, with A being the surface area of the ferromagnetic layers, and $V_{avg} = AT_{avg}$ where the parameter $T_{avg}$ is $$T_{avg} = \frac{T_1 + T_2}{2}.$$

Similarly, the derivative with respect $\theta_2$ of the total energy to provide the torque $\tau_2$ and setting it equal to zero as indicated above yields $$\tau_2 = [H_{k2}M_{s2} + 4\pi M_{s2}^2 T_2(F_L - F_W)]V_2\sin(\theta_2)\cos(\theta_2) - H_w M_{s2} V_2 \sin(\theta_2) -$$
$$(S_2 H_s - H_b)M_{s2}V_2\cos(\theta_2) + H_e M_{s-avg} V_2 \frac{T_{avg}}{T_2}\sin(\theta_1 + \theta_2) -$$
$$T_1 4\pi F_W M_{s1} M_{s2} V_2 \sin(\theta_1)\cos(\theta_2) - T_1 4\pi F_L M_{s1} M_{s2} V_2 \cos(\theta_1)\sin(\theta_2)$$
$$= 0.$$

A possibility for determining the equilibrium angles and the switching thresholds is to use one of these torque equations to eliminate the dependence in the total energy equation on either one of the magnetization direction rotational angles, and then find the second derivative of the energy and set it to zero to determine the point in which the system is going from a stable equilibrium to an unstable one, i.e. the switching point, yielding $$\frac{d^2 E_{Tot}(\theta_x)}{d\theta_x^2} = 0.$$

Alternatively, the two torque equations can be solved self-consistently to obtain the desired solutions. Furthermore, the resistance characteristics for the corresponding bit structure can be plotted versus applied word line current generated field which closely match those shown in FIGS. 3, 4A and 4B using these results and $$R = R_o + \Delta R \sin\left(\frac{\theta_1 - \theta_2}{2}\right).$$

Although the present invention has been described with reference to preferred embodiments, workers skilled in the art will recognize that changes may be made in form and detail without departing from the spirit and scope of the invention.

What is claimed is:

1. A magnetoresistive, ferromagnetic thin-film based digital memory, said memory comprising:

a first storage line structure having a first storage line pair of end terminal regions suited to conduct electrical current in at least one direction therethrough, said storage line end terminal regions having electrically connected therebetween at least one bit structure, each said bit structure comprising:

an intermediate layer, said intermediate layer having two major surfaces on opposite sides thereof such that said major surfaces are separated by less than 50 Å; and a memory film of a magnetoresistive, anisotropic ferromagnetic material less than 100 Å thick on each of said intermediate layer major surfaces of substantially matching composition but of thicknesses differing from one another outwardly from those surfaces by at least 5% to thereby primarily provide switching thresholds for magnetizations of said film adjacent each of said intermediate layer major surfaces that differ in value for a switching of these magnetizations from both being directed initially in substantially a common direction to being directed in substantially opposite directions versus a switching from being directed initially in substantially opposite directions to both being directed in substantially a common direction; and a word line structure having a pair of word line end terminal regions adapted to conduct electrical current in at least one direction therethrough, said pair of word line end terminal regions having an electrical conductor electrically connected therebetween which is located across an electrical insulating layer from said memory film on one of said major surfaces of said intermediate layer of a corresponding said bit structure.

2. The apparatus of claim 1 wherein a said bit structure has a length and a width substantially perpendicular thereto that is smaller in extent than said length, said memory film in a said bit structure being characterized by an anisotropy field, and said width being sufficiently small that demagnetization fields arising in said memory film in response to its saturation magnetization being oriented along that said width exceed in magnitude said anisotropy field.

3. The apparatus of claim 1 wherein a said bit structure has a length along said first storage line structure and a width substantially perpendicular thereto that is smaller in extent than said length, and said bit structure further has a shaped end portion extending over a portion of said length in which said width gradually reduces to zero at an end thereof with at least part of said shaped end portion being covered by a bit juncture, said shaped end portion having an extent parallel to said length covered by said bit juncture which is less in extent along said length than said bit structure is wide plus twice those widths of a Néel magnetic domain wall in said memory film in that said bit structure.

4. The apparatus of claim 1 wherein said memory film at each of said major surfaces of said intermediate layer of at least one of said bit structures is arranged such that there are two separate films with one of said separate films on each of said major surfaces.

5. The apparatus of claim 1 wherein said storage line end terminal regions have electrically connected in series therebetween a plurality of said bit structures with each said bit structure electrically connected at a bit juncture to at least one other said bit structure, and wherein said word line structure is a first word line structure in a plurality of word line structures each having a pair of word line end terminal regions adapted to conduct electrical current in at least one direction therethrough with each of said pairs of word line end terminal regions having an electrical conductor electrically connected therebetween which is located across an electrical insulating layer from said memory film on one of said major surfaces of said intermediate layer of a corresponding one of said bit structures, and wherein a second storage line structure is provided substantially matching said first storage line structure including corresponding positional relationships with said plurality of word line structures.

6. The apparatus of claim 2 wherein said memory film at each of said major surfaces of said intermediate layer of at least one of said bit structures is arranged such that there are two separate films with one of said separate films on each of said major surfaces.

7. The apparatus of claim 2 wherein said storage line end terminal regions have electrically connected in series therebetween a plurality of said bit structures with each said bit structure electrically connected at a bit juncture to at least one other said bit structure, and wherein said word line structure is a first word line structure in a plurality of word line structures each having a pair of word line end terminal regions adapted to conduct electrical current in at least one direction therethrough with each of said pairs of word line end terminal regions having an electrical conductor electrically connected therebetween which is located across an electrical insulating layer from said memory film on one of said major surfaces of said intermediate layer of a corresponding one of said bit structures, and wherein a second storage line structure is provided substantially matching said first bit line structure including corresponding positional relationships with said plurality of word line structures.

8. The apparatus of claim 3 wherein said memory film at each of said major surfaces of said intermediate layer of at least one of said bit structures is arranged such that there are two separate films with one of said separate films on each of said major surfaces.

9. The apparatus of claim 3 wherein said storage line end terminal regions have electrically connected in series therebetween a plurality of said bit structures with each said bit structure electrically connected at a bit juncture to at least one other said bit structure, and wherein said word line structure is a first word line structure in a plurality of word line structures each having a pair of word line end terminal regions adapted to conduct electrical current in at least one direction therethrough with each of said pairs of word line end terminal regions having an electrical conductor electrically connected therebetween which is located across an electrical insulating layer from said memory film on one of said major surfaces of said intermediate layer of a corresponding one of said bit structures, and wherein a second storage line structure is provided substantially matching said first bit line structure including corresponding positional relationships with said plurality of word line structures.

10. The apparatus of claim 4 wherein said bit structure has a length and a width substantially perpendicular thereto that is smaller in extent than said length, said width being less than about two curling lengths of said separate films from edges thereof substantially perpendicular to said width.

11. The apparatus of claim 4 wherein said memory film at each of said major surfaces is a composite film having a thinner stratum of higher magnetic saturation induction adjacent said intermediate layer and a thicker stratum of lower magnetic saturation induction.

12. A magnetoresistive, ferromagnetic thin-film based digital memory, said memory comprising:
a first storage line structure having a first storage line pair of end terminal regions suited to conduct electrical current in at least one direction therethrough, said storage line end terminal regions having electrically connected therebetween at least one bit structure, each said bit structure comprising:
an intermediate layer, said intermediate layer having two major surfaces on opposite sides thereof such that said major surfaces are separated by less than 50 Å; and
a memory film of a magnetoresistive, anisotropic ferromagnetic material less than 100 Å thick on each of said intermediate layer major surfaces of thicknesses differing from one another outwardly from those surfaces sufficiently greatly, for a selected current being conducted through said bit structure, to prevent magnetizations of said memory film adjacent those surfaces, oriented initially in a direction substantially opposite that of a word line magnetic field generated in a word line field direction by a current supplied in a word line conductor adjacent thereto as a result of a relatively rapid change in current magnitude initiated in said adjacent word line conductor, from both pointing in said word line field direction as a result of such a said current magnitude change initiation which would otherwise occur absent said thickness difference even though that magnitude of said word line magnetic field, resulting after expiration of transients therein following such a said current change initiation, is less than that switching threshold magnitude characterizing said thicker memory film if switched by a word line magnetic field resulting from a relatively slowly changing current in said adjacent word line conductor; and a word line structure having a pair of word line end terminal regions adapted to conduct electrical current in at least one direction therethrough, said pair of word line end terminal regions having an electrical conductor electrically connected therebetween which is located across an electrical insulating layer from said memory film on one of said major surfaces of said intermediate layer of a corresponding said bit structure as said adjacent word line conductor therefor.

13. The apparatus of claim 12 wherein a said bit structure has a length and a width substantially perpendicular thereto that is smaller in extent than said length, said memory film in a said bit structure being characterized by an anisotropy field, and said width being sufficiently small that demagnetization fields arising in said memory film in response to its saturation magnetization being oriented along that said width exceed in magnitude said anisotropy field.

14. The apparatus of claim 12 wherein a said bit structure has a length along said first storage line structure and a width substantially perpendicular thereto that is smaller in extent than said length, and said bit structure further has a shaped end portion extending over a portion of said length in which said width gradually reduces to zero at an end thereof with at least part of said shaped end portion being covered by a bit juncture, said shaped end portion having an extent parallel to said length covered by said bit juncture which is less in extent along said length than said bit structure is wide plus twice those widths of a Néel magnetic domain wall in said memory film in that said bit structure.

15. The apparatus of claim 12 wherein said memory film of each of said major surfaces of said intermediate layer of at least one of said bit structures is arranged such that there are two separate films with one of said separate films on each of said major surfaces.

16. The apparatus of claim 12 wherein said storage line end terminal regions have electrically connected in series therebetween a plurality of said bit structures with each said bit structure electrically connected at a bit juncture to at least one other said bit structure, and wherein said word line structure is in a plurality of word line structures each having a pair of word line end terminal regions adapted to conduct electrical current in at least one direction therethrough with each of said pairs of word line end terminal regions having an electrical conductor electrically connected therebetween which is located across an electrical insulating layer from said memory film on one of said major surfaces of said intermediate layer of a corresponding one of said bit structures, and wherein a second storage line structure is provided substantially matching said first bit line structure including corresponding positional relationships with said plurality of word line structures.

17. The apparatus of claim 13 wherein said memory film of each of said major surfaces of said intermediate layer of at least one of said bit structures is arranged such that there are two separate films with one of said separate films on each of said major surfaces.

18. The apparatus of claim 13 wherein said storage line end terminal regions have electrically connected in series therebetween a plurality of said bit structures with each said bit structure electrically connected at a bit juncture to at least one other said bit structure, and wherein said word line structure is a first word line structure in a plurality of word line structures each having a pair of word line end terminal regions adapted to conduct electrical current in at least one direction therethrough with each of said pairs of word line end terminal regions having an electrical conductor electrically connected therebetween which is located across an electrical insulating layer from said memory film on one of said major surfaces of said intermediate layer of a corresponding one of said bit structures, and wherein a second storage line structure is provided substantially matching said first bit line structure including corresponding positional relationships with said plurality of word line structures.

19. The apparatus of claim 14 wherein said memory film of each of said major surfaces of said intermediate layer of at least one of said bit structures is arranged such that there are two separate films with one of said separate films on each of said major surfaces.

20. The apparatus of claim 14 wherein said storage line end terminal regions have electrically connected in series therebetween a plurality of said bit structures with each said bit structure electrically connected at a bit juncture to at least one other said bit structure, and wherein said word line structure is a first word line structure in a plurality of word line structures each having a pair of word line end terminal regions adapted to conduct electrical current in at least one direction therethrouch with each of said pairs of word line end terminal regions having an electrical conductor electrically connected therebetween which is located across an electrical insulating layer from said memory film on one of said major surfaces of said intermediate layer of a corresponding one of said bit structures, and wherein a second storage line structure is provided substantially matching said first storage line structure including corresponding positional relationships with said plurality of word line structures.

21. The apparatus of claim 15 wherein said bit structure has a length and a width substantially perpendicular thereto that is smaller in extent than said length, said width being less than about two curling lengths of said separate films from edges thereof substantially perpendicular to said width.

22. The apparatus of claim 15 wherein said memory film at each of said major surfaces is a composite film having a thinner stratum of higher magnetic saturation induction adjacent said intermediate layer and a thicker stratum of lower magnetic saturation induction.

23. A magnetoresistive, ferromagnetic thin-film based digital memory, said memory comprising:

a first storage line structure having a first storage line pair of end terminal regions suited to conduct electrical current in at least one direction therethrough, said storage line end terminal regions having electrically connected therebetween at least one bit structure having a length and a width substantially perpendicular thereto that is smaller in extent than said length, each said bit structure comprising:

an intermediate layer, said intermediate layer having two major surfaces on opposite sides thereof such that said major surfaces are separated by less than 50 Å; and a memory film of a magnetoresistive, anisotropic ferromagnetic material less than 100 Å thick on each of said intermediate layer major surfaces of thicknesses differing from one another outwardly from those surfaces by at least 5%, said memory film in a said bit structure being characterized by an anisotropy field, and said width being sufficiently small that demagnetization fields arising in said memory film in response to its saturation magnetization being oriented along that said width exceed in magnitude said anisotropy field; and a word line structure having a pair of word line end terminal regions adapted to conduct electrical current in at least one direction therethrough, said pair of word line end terminal regions having an electrical conductor electrically connected therebetween which is located across an electrical insulating layer from said memory film on one of said major surfaces of said intermediate layer of a corresponding said bit structure.

24. The apparatus of claim 23 wherein a said bit structure has a length along said first storage line structure and a width substantially perpendicular thereto that is smaller in extent than said length, and said bit structure further has a shaped end portion extending over a portion of said length in which said width gradually reduces to zero at an end thereof with at least part of said shaped end portion being covered by a bit juncture, said shaped end portion having an extent parallel to said length covered by said bit juncture which is less in extent along said length than said bit structure is wide plus twice those widths of a Néel magnetic domain wall in said memory film in that said bit structure.

25. The apparatus of claim 23 wherein said memory film at each of said major surfaces of said intermediate layer of at least one of said bit structures is arranged such that there are two separate films with one of said separate films on each of said major surfaces.

26. The apparatus of claim 23 wherein said storage line end terminal regions have electrically connected in series therebetween a plurality of said bit structures with each said bit structure electrically connected at a bit juncture to at least one other said bit structure, and wherein said word line structure is a first word line structure in a plurality of word line structures each having a pair of word line end terminal regions adapted to conduct electrical current in at least one direction therethrouh with each of said pairs of word line end terminal regions having an electrical conductor electrically connected therebetween which is located across an electrical insulating layer from said memory film on one of said major surfaces of said intermediate layer of a corresponding one of said bit structures, and wherein a second storage line structure is provided substantially matching said first storage line structure including corresponding positional relationships with said plurality of word line structures.

27. The apparatus of claim 24 wherein said memory film at each of said major surfaces of said intermediate layer of at least one of said bit structures is arranged such that there are two separate films with one of said separate films on each of said major surfaces.

28. The apparatus of claim 24 wherein said storage line end terminal regions have electrically connected in series therebetween a plurality of said bit structures with each said bit structure electrically connected at a bit juncture to at least one other said bit structure, and wherein said word line structure is in a plurality of word line structures each having a pair of word line end terminal regions adapted to conduct electrical current in at least one direction therethrough with each of said pairs of word line end terminal regions having an electrical conductor electrically connected therebetween which is located across an electrical insulating layer from said memory film on one of said major surfaces of said intermediate layer of a corresponding one of said bit structures, and wherein a second storage line structure is provided substantially matching said first bit line structure including corresponding positional relationships with said plurality of word line structures.

29. The apparatus of claim 25 wherein said bit structure has a length and a width substantially perpendicular thereto that is smaller in extent that said length, said width being less than about two curling lengths of said separate films from edges thereof substantially perpendicular to said width.

30. The apparatus of claim 25 wherein said memory film at each of said major surfaces is a composite film having a thinner stratum of higher magnetic saturation induction adjacent said intermediate layer and a thicker stratum of lower magnetic induction.

31. The apparatus of claim 1 wherein said intermediate layer is a nonmagnetic electrical conductor.

32. The apparatus of claim 1 wherein said intermediate layer is a nonmagnetic electrical insulator.

33. The apparatus of claim 1 wherein a said bit structure has a length and a width substantially perpendicular thereto that is smaller in extent than said length.

34. The apparatus of claim 33 wherein said bit structure further has a shaped end portion extending over a portion of said length in which said width gradually reduces to zero at an end thereof.

35. The apparatus of claim 33 wherein a ratio of said length to said width exceeds five.

36. The apparatus of claim 12 wherein said intermediate layer is a nonmagnetic electrical conductor.

37. The apparatus of claim 12 wherein said intermediate layer is a nonmagnetic electrical insulator.

38. The apparatus of claim 12 wherein a said bit structure has a length and a width substantially perpendicular thereto that is smaller in extent than said length.

39. The apparatus of claim 38 wherein said bit structure further has a shaped end portion extending over a portion of said length in which said width gradually reduces to zero at an end thereof.

40. The apparatus of claim 38 wherein a ratio of said length to said width exceeds five.

41. The apparatus of claim 23 wherein said intermediate layer is a nonmagnetic electrical conductor.

42. The apparatus of claim 23 wherein said intermediate layer is a nonmagnetic electrical insulator.

43. The apparatus of claim 23 wherein said bit structure further has a shaped end portion extending over a portion of said length in which said width gradually reduces to zero at an end thereof.

44. The apparatus of claim 23 wherein a ratio of said length to said width exceeds five.

45. The apparatus of claim 23 wherein said memory film on each of said intermediate layer major surfaces have thicknesses differing from one another outwardly from those surfaces by at least 5%.

* * * * *

UNITED STATES PATENT AND TRADEMARK OFFICE
CERTIFICATE OF CORRECTION

PATENT NO. : 5,949,707
DATED : SEPTEMBER 7, 1999
INVENTOR(S) : ARTHUR V. POHM ET AL.

It is certified that error appears in the above-identified patent and that said Letters Patent is hereby corrected as shown below:

Col. 11, line 63, delete "presence the", insert --presence of the--

Signed and Sealed this

Eleventh Day of July, 2000

Attest:

Q. TODD DICKINSON

*Attesting Officer*     *Director of Patents and Trademarks*

UNITED STATES PATENT AND TRADEMARK OFFICE
CERTIFICATE OF CORRECTION

PATENT : 5,949,707

DATED : September 7, 1999

INVENTOR(S) : Arthur V. Pohm et al

It is certified that error appears in the above-identified patent and that said Letters Patent is hereby corrected as shown below:

Col. 5, line 55, delete "anisotropy", insert –anistropic---.

Signed and Sealed this

First Day of May, 2001

Attest:

NICHOLAS P. GODICI

*Attesting Officer*     *Acting Director of the United States Patent and Trademark Office*

UNITED STATES PATENT AND TRADEMARK OFFICE
CERTIFICATE OF CORRECTION

PATENT NO. : 5,949,707
APPLICATION NO. : 08/704315
DATED : September 7, 1999
INVENTOR(S) : Arthur V. Pohm et al.

It is certified that error appears in the above-identified patent and that said Letters Patent is hereby corrected as shown below:

Column 1, Line 9, insert the following paragraph between Cross-Reference To Related Application paragraph and Background of the Invention:

--This invention was made with Government support under Contract Number N00014-93-C-0251 awarded by the Ballistic Military Defense. The Government has certain rights in the invention.--

Signed and Sealed this

Twenty-fourth Day of June, 2008

JON W. DUDAS
*Director of the United States Patent and Trademark Office*